United States Patent
Kondo

(10) Patent No.: US 6,875,987 B2
(45) Date of Patent: Apr. 5, 2005

(54) SUBSTRATE HOLDING UNIT, EXPOSURE APPARATUS, AND DEVICE MANUFACTURING METHOD

(75) Inventor: Makoto Kondo, Kumagaya (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 10/293,321

(22) Filed: Nov. 14, 2002

(65) Prior Publication Data

US 2003/0127605 A1 Jul. 10, 2003

(30) Foreign Application Priority Data

Dec. 20, 2001 (JP) ........................................ 2001-387170
Nov. 12, 2002 (JP) ........................................ 2002-327988

(51) Int. Cl.[7] ................................................ G21K 5/10
(52) U.S. Cl. ............................ 250/442.11; 250/441.11; 250/492.2
(58) Field of Search ..................... 250/442.11, 441.11, 250/440.11, 492.2; 355/30, 53, 72, 73

(56) References Cited

U.S. PATENT DOCUMENTS 6,614,504 B2 * 9/2003 Aoki et al. .................. 355/30

FOREIGN PATENT DOCUMENTS

| JP | 8-31514 | 3/1996 |
|---|---|---|
| JP | 3000361 | 1/2000 |

* cited by examiner

*Primary Examiner*—Kiet T. Nguyen
(74) *Attorney, Agent, or Firm*—Oblon, Spivak, McClelland, Maier & Neustadt, P.C.

(57) ABSTRACT

On an upper surface of a main body configuring a holder main body, a plurality of pins and a rim portion which upper end surface is set at almost the same height with a surface formed by the tip portions of the pins are provided. In addition, the main body has a honeycomb structure. Also, through holes formed in the honeycomb core are arranged corresponding to the arrangement of the plurality of pins. And, by a vacuum chucking mechanism, a wafer is vacuum chucked with respect to the tip portions of the plurality of pins and the upper end surface of the rim portion. In addition, among the plurality of pins arranged, the pins arranged closed to the rim portion are spaced more densely than the pins arranged elsewhere on the main body.

32 Claims, 18 Drawing Sheets

SUBSTRATE HOLDING UNIT, EXPOSURE APPARATUS, AND DEVICE MANUFACTURING METHOD

BACKGROUND OF THE INVENTION

1. Field of the Invention

The present invention relates to substrate holding units, exposure apparatus, and device manufacturing methods, and more particularly to a substrate holding unit that holds plate-shaped substrates, an exposure apparatus that comprises the substrate holding unit serving as a holding unit for a substrate subject to exposure, and a device manufacturing method using the exposure apparatus.

2. Description of the Related Art

Conventionally, in a lithographic process for manufacturing devices such as a semiconductor device or a liquid crystal display device, exposure apparatus were used that transfer a pattern formed on a mask or a reticle (hereinafter generally referred to as a "reticle") onto a substrate such as wafer or a glass plate (hereinafter generally referred to as a "wafer") coated with a resist or the like, via a projection optical system. In recent years, due to higher integration of semiconductor devices, sequential moving type projection exposure apparatus are being widely used, such as a reduction projection exposure apparatus (the so-called stepper) based on a step-and-repeat method or a scanning projection exposure apparatus (the so-called scanning stepper) based on a step-and-scan method.

In these projection exposure apparatus, a wafer stage is provided that can move freely in a two dimensional plane, and a wafer is held by a wafer holder fixed on the wafer stage, by means such as vacuum chucking or electrostatic suction.

However, wafers and reticles are held by substrate holding units, which in turn are mounted on movable bodies such as a stage. Therefore, the total weight including the substrate holding unit and the movable body greatly influences position controllability (including position setting controllability) during the motion of the movable body. Therefore, for example, in the publication of Japanese Patent No. 3000361, a proposal is made for reducing the weight of the movable body on which the reticle is mounted, by providing holes (pockets) on a front surface side, a rear surface side, or the inside of the movable body.

However, it is difficult to simply apply the art disclosed in the above publication of reducing the weight of the movable body where a reticle holder is provided to a wafer holder, since the reticle holder holds the reticle only on both edges, whereas in the wafer holder, a vacuum chucking method is employed to hold the wafer fixed to the wafer holder. Therefore, in a conventional wafer holder, when holes are formed, the holes naturally have to be provided on the front surface side. If the holes are provided on the rear surface side or in the inside, vacuum chucking of the wafer will be difficult. And, even if holes that do not have any influence on the vacuum chucking are provided in the inside, the effect they will have in weight reduction will be small. That is, when holes are formed in a wafer holder, it is naturally a requirement for weight reduction, for the holes to be in common usage with holes for vacuum chucking.

In addition, in order to hold the wafer by suction while maintaining its flatness, the surface of the wafer holder requires an extremely high degree of flatness. Therefore, in the manufacturing process for making wafer holders, in the final process, a surface polishing process is included.

However, no matter how precisely and flat the surface is polished, when the shape and the size of the suction holes are determined without any consideration of vacuum chucking, inconvenience occurs, such as the wafer warping during vacuum chucking, the surface accuracy of the wafer not being secured due to the wafer surface reflecting the uneven shape of the surface of the wafer holder, or furthermore, a decline in rigidity. In addition, variation of rigidity in the holes formed for weight reduction purposes causes processing variation and step variation, and furthermore, only holes which sectional shape is a ring or holes that have only a small influence on the rigidity can be formed, which in turn produces only a small effect in weight reduction.

In addition, the recent requirements for shorter exposure wavelength and higher numerical apertures (N.A.) both lead to a narrower focal depth of the projection optical system, and when clamping of a foreign material occurs, it causes unevenness on the surface of the wafer, which is highly likely to cause a focal shift, leading to a degrading in transfer accuracy.

To prevent the clamping of foreign materials as much as possible, recently, for example, as is disclosed in Japanese Patent Laid-open No. 01-129438, a wafer holder based on a pin chuck method is relatively frequently used. With this wafer holder, a large number of pin-shaped support members (hereinafter referred to as "pins") support the wafer, and by using such a wafer holder occurrence of the above clamping of foreign materials can be suppressed almost without fail.

FIG. 18A shows a planar view of an example of a conventional wafer holder similar to the one disclosed in the above publication. A wafer holder 25', shown in FIG. 18A, comprises: a base member 26' having a circular plate shape; multiple pins 32' arranged on the upper surface of base member 26' (a surface closer to the page surface in the drawing) with equal space; and a ring-shaped protruded portion (hereinafter referred to as "rim portion") 28'. And, multiple pins 32' and rim portion 28' support the wafer from below, as well as hold the wafer by suction, such as by vacuum chucking.

In the conventional wafer holder described above, for example, when the wafer was supported with the pins by vacuum chucking or the like, arrangement and space and the like of the pins were set so that the deformation amount of the wafer was within a predetermined permissible amount at positions where the pins did not support the wafer.

In addition, in order to secure the degree of flatness of the wafer (substrate), the contact portion of the wafer holder to the wafer is preferably flush to the wafer. Therefore, in the manufacturing stage of making the wafer holder, a precision polishing is performed on the upper surface of the pins and the rim portion, using a polishing unit.

In wafer holder 25' shown in FIG. 18A, or in the wafer holder disclosed in the above publication, in order to avoid clamping of foreign materials in between the pins and the wafer as much as possible, a contact ratio of the pins was set at a minimum within the limits of the permissible range of deformation in the above description. On the other hand, the rim portion results in exceeding a constant width, due to limitations in the polishing technique. Accordingly, the proportion of the contact area of the rim portion becomes large in the total contact ratio, when the contact ratio of the pins set based on the amount of the above deformation is small.

In addition, when a method of setting the contact ratio of the pins related to the above conventional art is employed, during the polishing process in the manufacturing stage, the contact pressure of the pins per unit area with respect to the polishing portion (processing portion) of the polishing unit is larger when compared with the rim portion. Also, the pins have sufficient coverage of abrasive grains used during polishing, whereas in the rim portion the coverage of abrasive grains tends to be insufficient. Therefore, the processing speed of the pins is faster when compared with the rim portion. And, due to this difference in the processing speed, in between the pins and the rim portion, as is shown in FIG. 18B, which shows an end view of a vertical section of wafer holder 25' in FIG. 18A holding a wafer W by suction, a processing step Δa is made in between rim portion 28' and pins 32'. For such reasons, a deformation having an angle of inclination θ is formed in the free edge portion of wafer W, in the vicinity of the outer edge portion, which in turn causes defocusing to occur during exposure. Especially with the recent trend of trying to obtain chips from the portion close to the outer edge of the wafer, deformation in the outer edge of the wafer as in the above description may become a cause a decrease in yield of devices serving as an end product.

Meanwhile, since exposure apparatus are used for mass production of microdevices such as a semiconductor device, requirements on improving throughput (processing capacity) are pressing, on a par with, or even with more pressure than improving the exposure accuracy, and it is beyond question that one of the key points is to improve the performance of the wafer stage, especially to improve the positional controllability which includes higher speed, higher acceleration, and higher position setting accuracy.

SUMMARY OF THE INVENTION

The present invention was made under such circumstances, and has as its first object to provide a substrate holding unit that can support a substrate in a state where its degree of flatness is maintained at a high level, while decreasing the weight of the unit.

The second object of the present invention is to provide an exposure apparatus which throughput can be improved by improving the position controllability of the substrate.

The third object of the present invention is to provide a substrate holding unit that can reduce a processing step which occurs on the contact surface with the substrate during the polishing process to the utmost.

In addition, the fourth object of the present invention is to provide an exposure apparatus that can improve exposure accuracy.

And, the fifth object of the present invention is to provide a device manufacturing method that can improve the productivity of high integration devices.

According to the first aspect of the present invention, there is provided a first substrate holding unit that holds a plate-shaped substrate, the unit comprising: a holding unit main body that has a plurality of projected first supports arranged on a surface of the holding unit main body within a predetermined area with each of the tip portions arranged almost flush, supporting the substrate, and a plurality of hollow spaces are formed in an arrangement corresponding to an arrangement of the plurality of first supports in a portion excluding the surface of the holding unit main body, in at least a portion between the surface and a surface located on the other side of the surface.

In general, a substrate holding unit based on a pin-chuck method is considered capable of effectively suppressing unevenness on a surface of a substrate by devising the arrangement of pins, although there are disadvantages that the unevenness caused by the arrangement of the pins are reflected directly onto the surface of the wafer, forming an uneven shape. In addition, in the substrate holding unit based on a pin-chuck method, the height of the pin itself can be sufficiently small, compared with the height of the entire substrate holding unit. Accordingly, the weight of the holding unit main body of the substrate holding unit on which the pins are arranged can be sufficiently decreased, so long as its rigidity can be maintained. As a result of extensive research focusing on such points, the inventor completed the first substrate holding unit of the present invention.

In the description, the term "a portion excluding the surface of the holding unit main body, in at least a portion between the surface and a surface located on the other side of the surface" includes both the portion in between a surface portion on one surface side and a surface portion on the other surface side, and the entire portion except for the surface portion on the one surface side. In addition, the concept of "hollow space" includes a hollow portion as well as a recessed hole (opening) of a predetermined depth which opening is on the other side of the surface. Furthermore, "an arrangement corresponding to an arrangement of the plurality of first supports" means that as long as there is some kind of a corresponding relation between the arrangement of the plurality of first supports and the plurality of hollow spaces, it is sufficient enough for the invention. In the present invention, this corresponding relation only requires employing an arrangement of the first supports so that the substrate can be held with a good degree of flatness, and setting the arrangement of the plurality of hollow spaces based on the arrangement of the first supports.

With the first substrate holding unit in the present invention, in the holding unit main body, the plurality of projecting shaped first supports are arranged on one surface of the holding unit main body, set so that the tip of each of the first supports are almost flush with one another. The plurality of hollow spaces are formed in the portion excluding the surface of the holding unit main body, in at least the portion between the surface and a surface on the other side of the surface, in an arrangement corresponding to the arrangement of the plurality of first supports. Therefore, with the tips of the plurality of the projected first supports, the substrate can be supported in an almost flat state. In addition, since the plurality of hollow spaces are formed either in the between the surface and a surface on the other side of the surface or in the entire portion excluding the surface of the holding unit main body, the weight of the holding unit main body can be reduced due to the hollow spaces. In addition, since the plurality of hollow spaces are formed in the holding unit main body corresponding to the arrangement of the plurality of first supports, the substrate supporting functions of the plurality of first supports are safe from any sufficient damage by the plurality of hollow spaces. Accordingly, the substrate holding unit can support the substrate maintaining a high degree of flatness, while reducing its weight.

In this case, the first supports can be arranged on the surface of the holding unit main body, with at least one first support individually corresponding to each of the hollow spaces.

In this case, the plurality of hollow spaces may be spaced constantly apart on the holder unit main body two-dimensionally, and the first supports that are arranged with at least one first support individually corresponding to each of the hollow spaces, may be totally arranged with equal spacing. Or, the plurality of first supports may be arranged so that spacing in between the first supports partially differ on the surface of the holding unit main body, and the plurality of hollow spaces may be arranged in the portions of the holding unit main body (the portion in between the surface and a surface located on the other side of the surface, or the entire portion except for the surface), with at least one of spacing and size different. In the latter case, various arrangements for the plurality of first supports can be employed, such as for example, arranging the first supports so that the space in between the supports are denser when moving from the center to the periphery, or arranging the supports in an opposite manner.

With the first substrate holding unit in the present invention, the holding unit main body can be configured of a single member, however, the holing unit main body can be integrally formed including: a first member that makes up the plurality of first supports; and a second member that is provided on the other side of the surface, and the plurality of hollow spaces can be formed in at least one of the first member and the second member.

As is described, in the first substrate holding unit in the present invention, various methods can be considered to integrally configure the holding unit main body. For example, the holding unit main body may be integrally formed, by welding at least the same material as the first member. Or, for example, the holding unit main body may be integrally formed, by welding at least a different material as the first member. Furthermore, the holding unit main body may be integrally formed, by using adhesives. When the holding unit main body is integrally formed, by welding "a different material," materials such as metal, especially aluminum, can be used.

With the first substrate holding unit in the present invention, the holding unit main body can be made up of: a plurality of first members on the surface side; a second member on a surface located on the other side of the surface; and a core member in which the plurality of hollow spaces are formed, and the holding unit main body can have a sandwich structure, clamping the core member in between the first member and the second member.

In this case, the core member can be a honeycomb core.

With the first substrate holding unit in the present invention, the holding unit main body can further have a second support, which is arranged outside the predetermined area on the surface of the holding unit main body, enclosing the area and supporting the substrate in a state where its degree of flatness is almost maintained with the plurality of first supports.

In this case, the substrate holding unit can further comprise: a suction mechanism that suctions the substrate with respect to a tip portion of each of the plurality of first supports and an upper end portion of the second support.

With the first substrate holding unit in the present invention,

With the first substrate holding unit in the present invention, when holding unit main body has a second support, among the plurality of first supports, at least the first supports located in the vicinity of the second support can be arranged with denser spacing compared with the first supports located elsewhere. Or, a contact area of the second support with the substrate can be set at 20% and under of a total contact area of the plurality of first supports and the second support with the substrate.

According to the second aspect of the present invention, there is provided a first exposure apparatus that exposes a substrate with an energy beam to form a predetermined pattern, the exposure apparatus comprising: the first substrate holding unit according to the present invention which holds the substrate; and a substrate stage on which the substrate holding unit is mounted, which is moveable in at least one direction in a two dimensional plane.

With the first exposure apparatus, the substrate is supported (or held) in a state where the degree of flatness is maintained at a high level with the first substrate holding unit of the present invention. And, since the weight is reduced in the substrate holding unit, which is mounted on the substrate stage, naturally, the entire weight of the moving portion on the substrate side including the substrate holding unit and the substrate stage is reduced. Therefore, position controllability of the moving portion on the substrate side (including position setting performance) is improved, which leads to, for example, reducing the position setting settling time of the substrate during exposure, and improving the throughput in the exposure process.

In this case, the exposure apparatus can further comprise: a mask stage that holds a mask on which the pattern is formed; a projection optical system that projects the energy beam emitted from the mask onto the substrate; a focal position detection system that detects a position related to an optical axis direction of the projection optical system and an amount of tilt with respect to a surface perpendicular to the optical axis direction of a surface of the substrate held by the substrate holding unit; and a drive unit that drives the substrate holding unit in at least one of the optical axis direction and a direction of inclination with respect to a surface perpendicular to the optical axis direction, based on detection results of the focal position detection system.

In this case, the exposure apparatus can further comprise: a synchronous drive unit that synchronously drives the mask stage and the substrate stage in the one direction.

According to the third aspect of the present invention, there is provided a second substrate holding unit which holds a plate-shaped substrate, the unit comprising: a holding unit main body that has a plurality of projected first supports arranged within a predetermined area with each of the tip portions arranged almost flush, supporting the substrate, and a second support, which is arranged outside the area, enclosing at least a large part outside the area, wherein the substrate is supported with the plurality of first supports and the second support in a state where its flatness is maintained, and among the plurality of first supports, at least the first supports located in the vicinity of the second support are arranged with denser spacing compared with the first supports located elsewhere.

With the second substrate holding unit, the plate-shaped substrate is supported in a state maintaining its degree of flatness by the plurality of first supports and the second support of the holding unit main body. In this case, among the plurality of first supports, at least the first supports located in the vicinity of the second support are arranged with denser spacing compared with the first supports located elsewhere. That is, the local contact ratio (area ratio of the contact surface) of at least the first supports close to the second support and the substrate can be made to near the local contact ratio (area ratio of the contact surface) of the second support and the substrate. Accordingly, for example, in the manufacturing stage of the substrate holding unit, when polishing is performed using polishing units or the like to flatten the surface of the substrate holding unit in direct contact with the substrate, a difference between contact pressure of the polishing portion (processing portion) on the second support and contact pressure on the first supports close to the second supports can be decreased. And, this allows a processing step that occurs in between both supports during the polishing process to be suppressed to the utmost. That is, the processing step created in the contact surface of the substrate holding unit (holding unit main body) with the substrate can be reduced to the utmost. As a result, deformation (an angle of inclination) occurring on the free edge portion close to the periphery of the substrate can be suppressed.

In this case, the plurality of first supports can be arranged so that the space in between adjacent first supports changes step by step, from the area close to the rim portion to the area around the center of the predetermined area and the area in between. The arrangement, however, is not limited to this, and the plurality of first supports can be arranged with spacing in between adjacent first supports wider when further away from the second support.

With the second substrate holding unit in the present invention, the plurality of first supports can be arranged in a plurality of rings of concentric circles with a reference point on the holding unit main body serving as a center, which corresponds to a center position of the substrate.

With the second substrate holding unit in the present invention, the substrate holding unit further comprising: a suction mechanism that suctions the substrate with respect to a tip portion of each of the plurality of first supports and an upper end portion of the second support.

In this case, means such as an electrostatic suction mechanism can be employed as the suction mechanism, however, for example, when the second support has a circular inner peripheral surface that entirely surrounds an area where the plurality of first supports are arranged, the suction mechanism can be a vacuum chucking mechanism that creates a vacuum state in a space formed with the substrate and the holding unit main body when the holding unit main body supports the substrate, at a side inside the inner peripheral surface of the second support.

In this case, the second support can have a circular protruded portion and a circular recessed portion arranged concentrically on an outer side of the protruded portion, and the vacuum chucking mechanism can create a vacuum state even in the circular recessed portion.

In this case, the circular protruded portion can be concentrically arranged having two rings and over, and the vacuum chucking mechanism can create a vacuum state even in a space formed in between adjacent rings of the circular protruded portions.

With the second substrate holding unit in the present invention, a contact area of the second support with the substrate can be set at 20% and under of a total contact area of the plurality of first supports and the second support with the substrate.

In this case, a proportion of a contact area of the plurality of first supports and the second support with the substrate can be set at 3% and under, in an entire area on a side of a surface of the substrate supported by the first supports and the second support.

According to the fourth aspect of the present invention, there is provided a second exposure apparatus that transfers a pattern formed on a mask onto a substrate via a projection optical system, the exposure apparatus comprising: the second substrate holding unit in the present invention; a focal position detection system that detects a position related to an optical axis direction of the projection optical system and an amount of inclination with respect to a surface perpendicular to the optical axis direction of a surface of the substrate held by the substrate holding unit; and a drive unit that drives the substrate holding unit in at least one of the optical axis direction and a direction of inclination with respect to a surface perpendicular to the optical axis direction, based on detection results of the focal position detection system.

With the second exposure apparatus, since the substrate is held with the second substrate holding unit in the present invention, the substrate, including the free edge portion close to the periphery of the substrate, is held maintaining a certain degree of flatness. That is, held in a relatively smooth state without any extreme roughness. Then, the focal position detection system detects the position in the optical axis direction and the amount of inclination with respect to the surface perpendicular to the optical axis of the substrate held by the substrate holding unit. And, based on the detection results, the drive unit drives the substrate holding unit in at least either the optical axis direction or in the direction of inclination with respect to the surface perpendicular to the optical axis. With this operation, even when a moderate tilt is detected on the substrate, by adjusting the inclination and the position in the optical direction of the entire substrate via the substrate holding unit, the pattern formed on the mask can be transferred onto the substrate with the image plane of the projection optical system coinciding with the exposure area (area subject to exposure) on the substrate. Accordingly, exposure with high precision is possible, with hardly any degrading in the transfer accuracy of the pattern caused by defocusing.

According to the fifth aspect of the present invention, there is provided a third substrate holding unit which holds a plate-shaped substrate, the unit comprising: a holding unit main body that has a plurality of projected first supports arranged within a predetermined area with each of the tip portions arranged almost flush, supporting the substrate, and a second support, which is arranged outside the area, enclosing at least a large part outside the area, wherein the substrate is supported with the plurality of first supports and the second support in a state where its flatness is almost maintained, and a contact area of the second support with the substrate is set at 20% and under of a total contact area of the plurality of first supports and the second support with the substrate.

With the third substrate holding unit, the substrate is held in a state almost maintaining its degree of flatness with the plurality of projected first supports and the second support of the holding unit main body. In this case, the contact area of the second support with the substrate is set so that it is 20% or under the total contact area of the plurality of first supports and the second support with the substrate. Regarding this issue, the present inventor focused his attention on the area where the plurality of first supports are in contact with the substrate, the area where the second support is in contact with the substrate, and the area where the plurality of first supports and the second support are in contact with the substrate (total contact area), and performed various simulations, experiments, and extensive research on the relation between these areas and the processing step. And, based on the results, the present inventor concluded that setting the contact area of the second support with the substrate at 20% or under the contact area of the plurality of first supports and the second support with the substrate (total contact area) is sufficiently practical.

More specifically, by setting the proportion of the contact area of the second support with the substrate at 20% and under the total contact area, the processing steps that are formed in between each supports in the polishing process during manufacture can be made extremely small, which results in making the deformation (angle of inclination) occurring on the free edge portions close to the periphery of the substrate smaller.

According to the sixth aspect of the present invention, there is provided a third exposure apparatus that transfers a pattern formed on a mask onto a substrate via a projection optical system, the exposure apparatus comprising: the third substrate holding unit in the present invention; a focal position detection system that detects a position related to an optical axis direction of the projection optical system and an amount of inclination with respect to a surface perpendicular to the optical axis direction of a surface of the substrate held by the substrate holding unit; and a drive unit that drives the substrate holding unit in at least one of the optical axis direction and a direction of inclination with respect to a surface perpendicular to the optical axis direction, based on detection results of the focal position detection system.

With the third exposure apparatus, since the substrate is held with the third substrate holding unit in the present invention, the substrate, including the free edge portion close to the periphery of the substrate, is held maintaining a certain degree of flatness, that is, held in a relatively smooth state without any extreme roughness. Then, the focal position detection system detects the position in the optical axis direction and the amount of inclination with respect to the surface perpendicular to the optical axis of the substrate held by the substrate holding unit. And, based on the detection results, the drive unit drives the substrate holding unit in at least either the optical axis direction or in the direction of inclination with respect to the surface perpendicular to the optical axis. With this operation, even when a moderate tilt is detected on the substrate, by adjusting the inclination and the position in the optical direction of the entire substrate via the substrate holding unit, the pattern formed on the mask can be transferred onto the substrate with the image plane of the projection optical system coinciding with the exposure area (area subject to exposure) on the substrate. Accordingly, exposure with high precision is possible, with hardly any degrading in the transfer accuracy of the pattern caused by defocusing.

In addition, in a lithographic process, by performing exposure using any one of the first to third exposure apparatus in the present invention, the pattern can be accurately formed on the substrate, which allows production of higher integrated devices with good yield. Accordingly, in the present invention, furthermore from another aspect, there is provided a device manufacturing method using any one of the first to third exposure apparatus in the present invention.

BRIEF DESCRIPTION OF THE DRAWINGS

In the accompanying drawings.

DETAILED DESCRIPTION OF THE PREFERRED EMBODIMENTS

First Embodiment

Following is a description of a first embodiment related to the present invention, referring to FIGS. 1 to 6.

Figure 1:
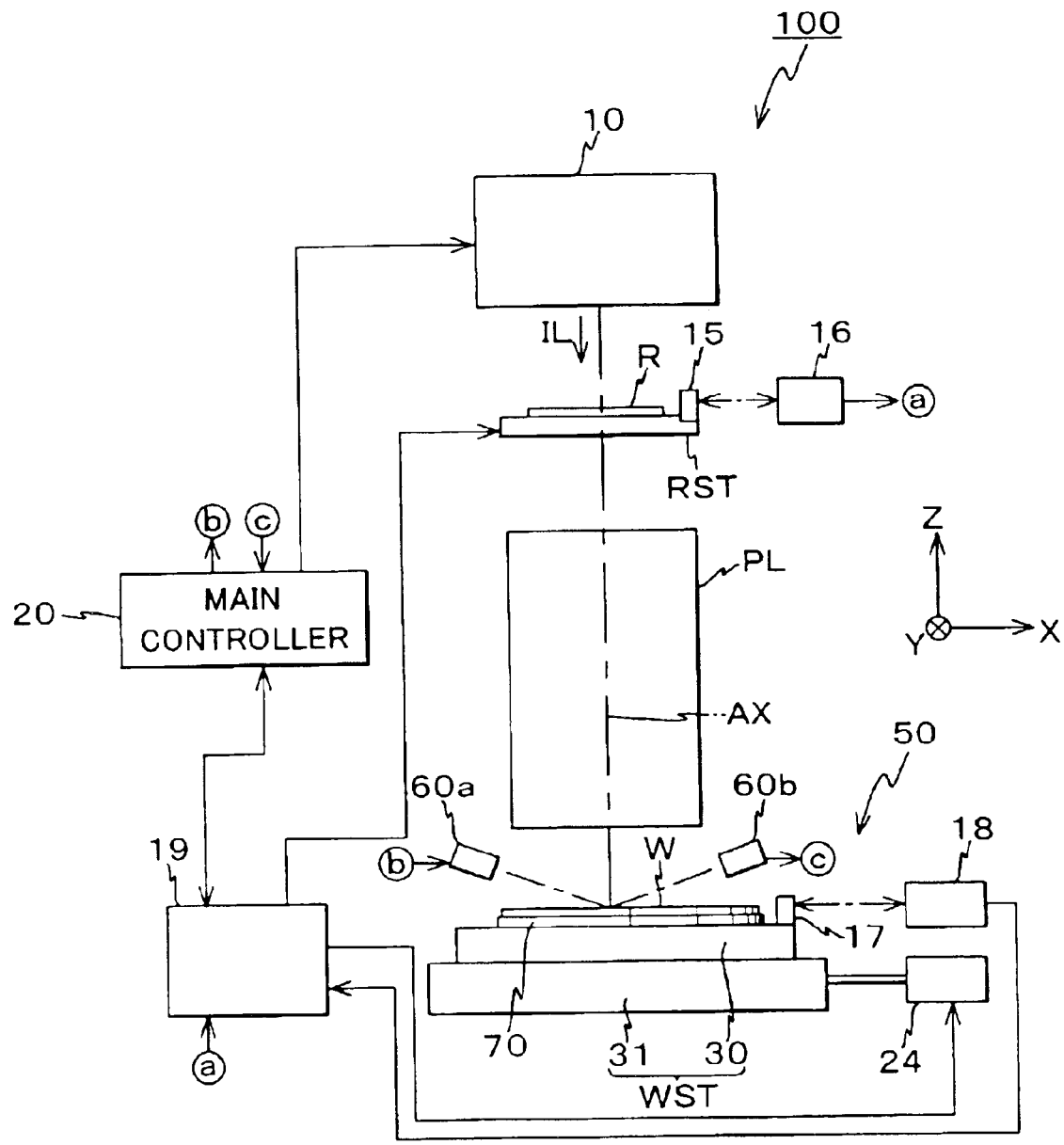
FIG. 1 is a view showing an entire configuration of an exposure apparatus related to a first embodiment in the present invention.

FIG. 1 shows an entire configuration of an exposure apparatus 100 related to the first embodiment. Exposure apparatus 100 is a projection exposure apparatus (the so-called scanning stepper) based on a step-and-scan method. Exposure apparatus 100 comprises: an illumination system 10; a reticle stage RST which holds a reticle R serving as a mask; a projection system PL; a stage unit 50 on which a wafer W serving as a substrate is mounted; a control system for these units; and the like.

Illumination system 10, as is disclosed in, for example, Japanese Patent Laid-open 06-349701 and the corresponding U.S. Pat. No. 5,534,970, has a structure including units such as a light source, an illuminance uniformity optical system including parts such as an optical integrator, a relay lens, a variable ND filter, a reticle blind (all of which are not shown). In illumination system 10, an illumination light IL serving as an energy beam illuminates a slit shaped illumination area which is set by the reticle blind on reticle R where a circuit pattern or the like is formed, with an almost uniform illuminance. The disclosure in the above U.S. patent is fully incorporated herein by reference.

As illumination light IL, a far ultraviolet light such as a KrF excimer laser beam (wavelength: 248 nm) or a vacuum ultraviolet light such as an ArF excimer laser beam (wavelength: 193 nm) or a $F_2$ laser beam (wavelength: 157 nm) is used. It is also possible to use an emission line (such as a g-line or an i-line) in an ultraviolet region emitted from an ultra-high pressure mercury lamp. In addition, as the optical integrator, a fly-eye lens, a rod integrator (an internal reflection type integrator), or a diffraction optical element can be used.

On reticle stage RST, reticle R is fixed to the stage by, for example, vacuum chucking. Reticle stage RST can be finely driven within an XY plane, which is perpendicular to the optical axis of illumination system 10 (which coincides with the optical axis of projection optical system PL, described later in the description) by a reticle stage drive section (not shown) that includes a linear motor or the like. Reticle stage RST can also be driven in a predetermined scanning direction (in this case, a Y-axis direction) in a designated scanning velocity.

The position of reticle stage RST within the stage movement plane is detected at all times with a reticle laser interferometer 16 (hereinafter referred to as "reticle interferometer") via a movable mirror 15, at a resolution of, for example, 0.5 to 1 nm. In actual, on reticle stage RST, a movable mirror that has a reflection surface perpendicular to the Y-axis direction and a movable mirror that has a reflection surface perpendicular to an X-axis direction are arranged, and corresponding to these movable mirrors, a reticle Y interferometer and a reticle X interferometer are arranged. In FIG. 1, however, these are representatively shown as movable mirror 15 and reticle interferometer 16. Incidentally, for example, an edge surface of reticle stage RST may be polished so as to form a reflection surface (corresponds to the reflection surface of mirror 15). In addition, instead of the reflection surface extending in the X-axis direction used for detection the position of reticle stage RST in the scanning direction (the Y-axis direction in the embodiment), at least one retroreflector may be used. In the embodiment, one of the reticle Y interferometer or the reticle X interferometer, for example, the reticle Y interferometer is a double axis interferometer that has two length measurement axes. And, based on the measurement values of the reticle Y interferometer, rotation in a rotational direction around a Z-axis ($\theta z$ direction) can be measured, in addition to the Y position of reticle stage RST.

Positional information on reticle stage RST from reticle interferometer 16 is provided to a main controller 20, via a stage control unit 19. According to instructions from main controller 20, stage control unit 19 controls the drive of reticle stage RST via reticle stage drive section (not shown), based on the positional information on reticle stage RST.

Projection optical system PL is arranged in a position below reticle stage RST in FIG. 1, and the direction of an optical axis AX is the Z-axis direction. As projection optical system PL, for example, a refraction optical system that is double telecentric and has a predetermined reduced magnification (such as ⅕ or ¼) is used. Therefore, when illumination light IL from illumination system 10 illuminates the illumination area of reticle R, illumination light IL that has passed through reticle R forms a reduced image (a partially inverted image) of the circuit pattern in the illumination area of reticle R on wafer W which surface is coated with a resist (photosensitive agent).

Stage unit 50 comprises: a wafer stage WST serving as a substrate stage; a holder main body 70 serving as a holding unit main body arranged on wafer stage WST; a wafer stage drive section 24 that drives wafer stage WST and holder main body 70; and the like. Wafer stage WST is arranged on a base (not shown) in a position below projection optical system PL in FIG. 1, and comprises: an XY stage 31 which is driven in the XY direction by linear motors or the like (not shown) making up wafer stage drive section 24; and a Z tilt stage 30 which is mounted on XY stage 31 and is finely driven in the Z-axis direction, the direction of inclination with respect to the XY plane (the rotational direction around the X-axis (the $\theta x$ direction), and the rotational direction around the Y-axis (the $\theta y$ direction) by a Z tilt drive mechanism (not shown) making up wafer stage drive section 24. And, holder main body 70, which holds wafer W, is mounted on Z tilt stage 30.

Holder main body 70 is structured of a material with a low thermal expansion rate, such as a ceramic (as an example, Schott ZERODUR (product name)). As is shown in a planar view in FIG. 2, holder main body 70 comprises: a main body 26 which exterior is a circular shaped plate of a predetermined thickness; multiple projected pins 32, serving as a plurality of first supports arranged with a predetermined space on a predetermined area around the center on the upper surface of main body 26 (the surface close to the page surface in FIG. 2), excluding a ring shaped area of a predetermined width in the vicinity of the outer periphery on the upper surface; a ring-shaped protruded portion (hereinafter referred to as "rim portion") 28 serving as a second support that is arranged in the vicinity of the outer periphery, in a state enclosing the area where the multiple pins 32 are arranged; and the like.

Figure 3:
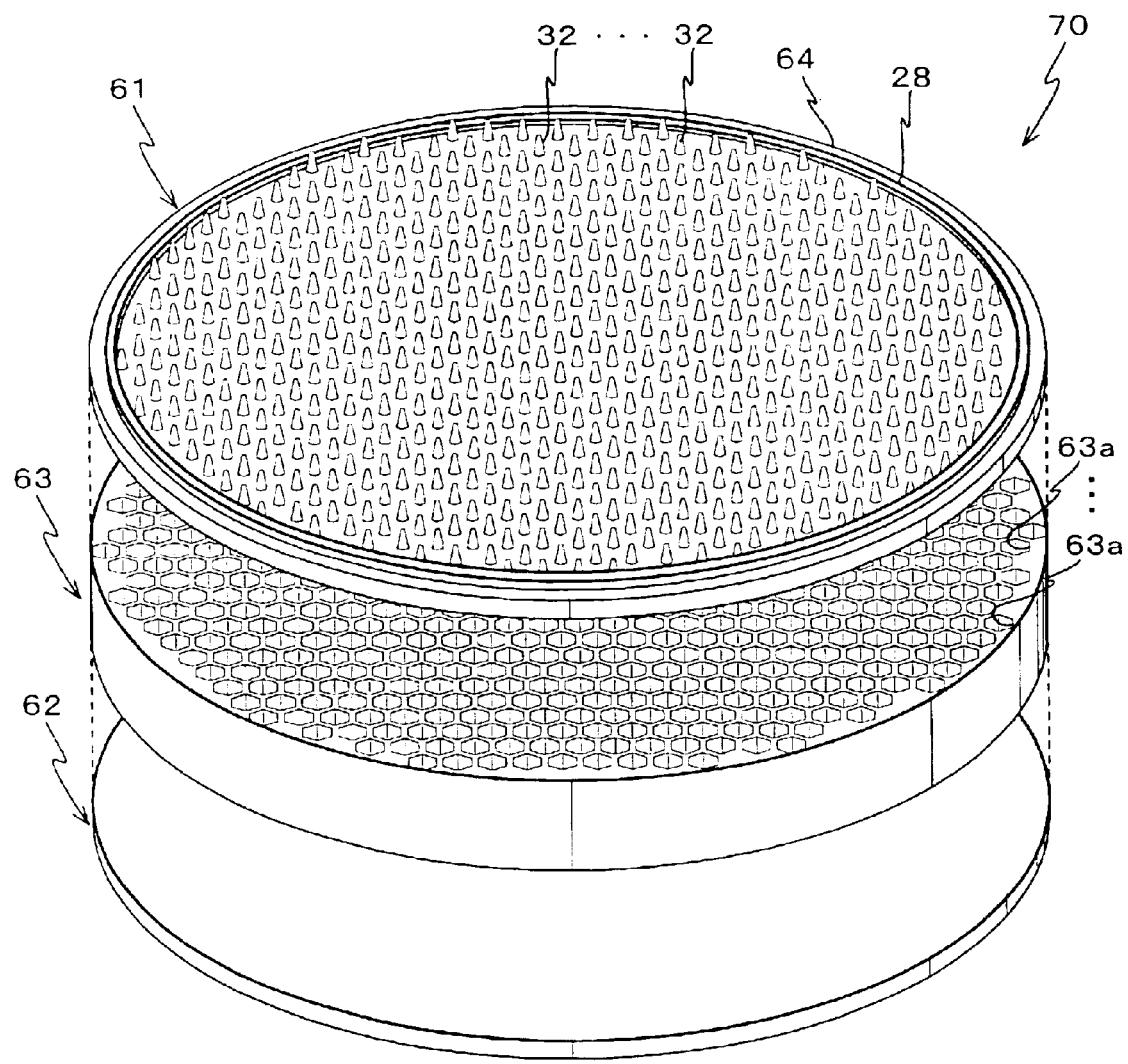
FIG. 3 is an exploded perspective view of the holder main body in FIG. 2.

As is shown in FIG. 3, which is an exploded perspective view of holder main body 70, main body 26 of holder main body 70 actually has a three-layer honeycomb sandwich structure. That is, main body 26 has a first member 61 made of a ceramic plate having a thickness t1 (t1 is, for example, around 2 to 5 mm), a second member 62 also made of a ceramic plate having the thickness t1, and a core member (honeycomb core) 63 made of a ceramic having a honeycomb structure; and core member 63 serves as a core that is sandwiched and joined together in between the first member 61 and the second member 62, such as by welding, so as to form the three-layer structure. In this case, the thickness of the honeycomb core 63 is around 12 to 15 mm.

Honeycomb core 63 has a large number of hollow portions 63a serving as a hollow space. Therefore, its entire weight is extremely light. On the contrary, the honeycomb sandwich structure is known for its extremely high rigidity, as is obvious from the fact that it is employed in places such as a tail unit of an aircraft.

Accordingly, the weight of holder main body 70 can be greatly reduced, while maintaining sufficient rigidity.

In the first member 61, a circular plate shaped base portion 64, and rim portion 28 and the plurality of pins 32 that are arranged protruded on the upper surface of base portion 64 are integrally formed, by etching on the entire surface of the disc shaped ceramic material.

Rim portion 28 has an outer diameter set slightly smaller that that of wafer W, such as 1 to 2 mm, and its upper surface is processed horizontally and evenly so that when wafer W is mounted no gaps appear between the upper surface and the rear surface of wafer W. The height of rim portion 28 from the upper surface of base portion 64 is to be around 0.01 to 0.3 mm.

Figure 4:
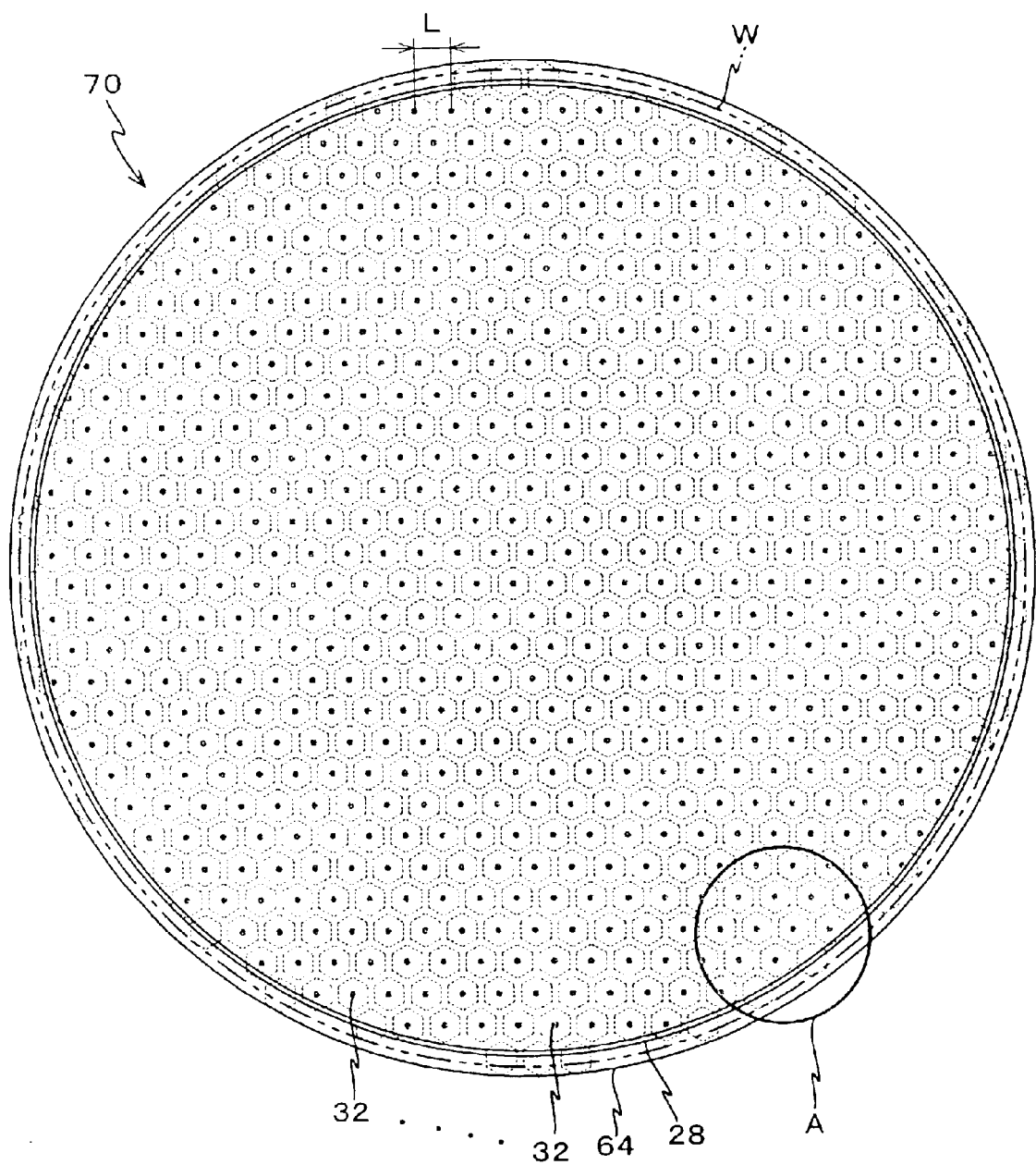
FIG. 4 is a planar view of the holder main body in FIG. 2.

Pins 32 have a projected shape where each of the tip portions are positioned flush with the rim portion 28. As is shown in FIG. 4, which shows a planar view of holder main body 70, these pins 32 are arranged at a constant space L (L is for example, 3 mm) in bilateral directions at an angle of ±30° with respect to the Y-axis direction. That is, with pins 32, three proximate pins are positioned so that each pin is located on a corner of an equilateral triangle. In this case, the arrangement space L of the pins is set so that the deformation amount of wafer W is within the permissible range when vacuum chucking is performed.

With the first member 61 of the above structure, in the manufacturing stage, after base portion 64, pins 32, and rim portion 28 are integrally formed as is previously described, the upper surface of the plurality of pins 28 and the upper surface of rim portion 28 that will be the contact surface with wafer W are polished, using polishing units, abrasive grains, and the like. As a consequence, the upper surface of the plurality of pins 32 is positioned almost flush with the upper surface of rim portion 28.

Figure 5:
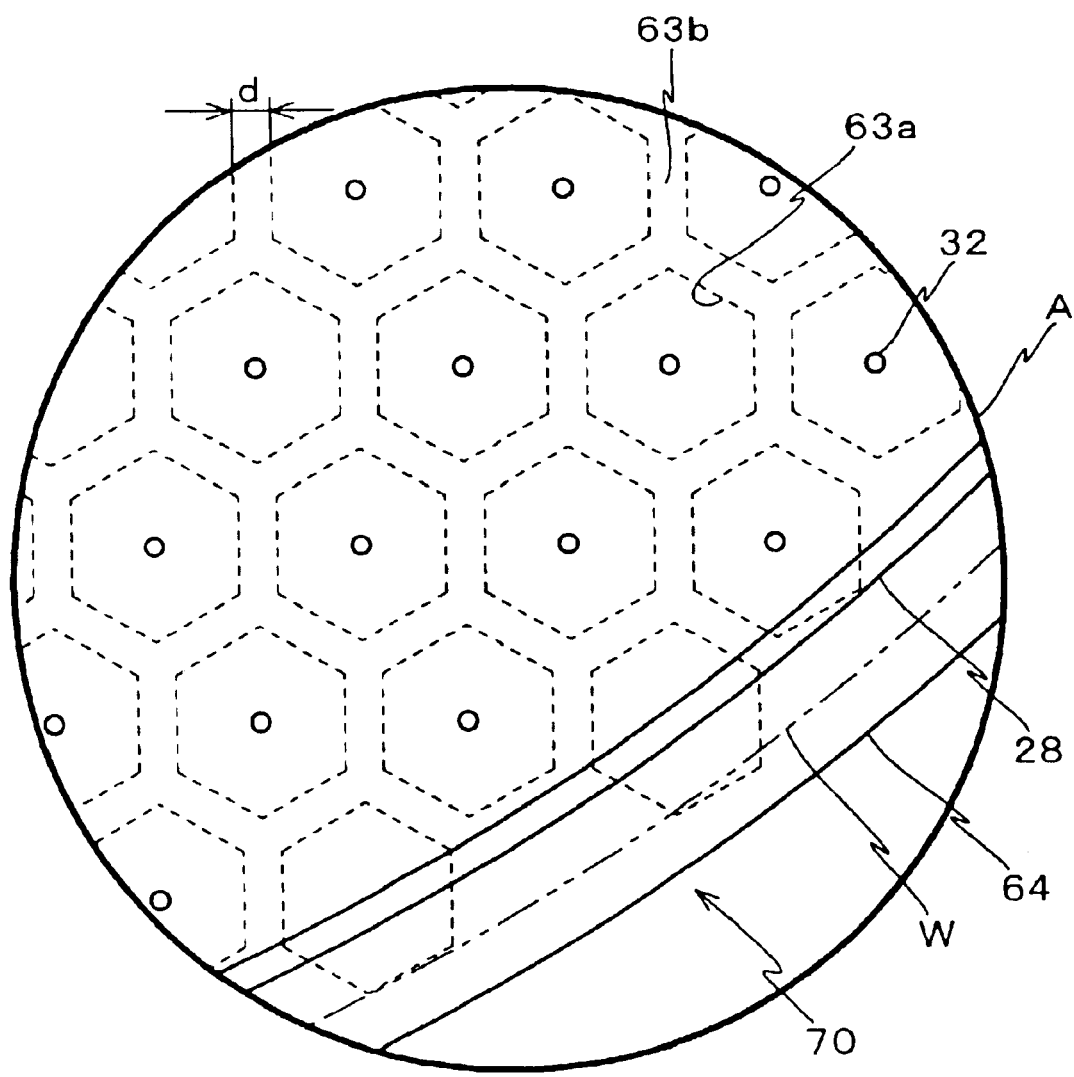
FIG. 5 is an enlarged view of the inside of a circle A in FIG. 4.

In the embodiment, as is shown in FIG. 4 and in FIG. 5, which is an enlarged view of an area circle A in FIG. 4, hollow portions 63*a* are formed in honeycomb core 63, serving as hollow spaces that each have an equilateral hexagon shape of the same area in a planar view (from above) which center matches each of the pins 32. That is, through holes 63*a* are formed in a vertical direction. Adjacent through holes 63*a* are partitioned with a rim 63*b*, serving as a partition wall of a predetermined thickness (d is, for example, 1 mm). Accordingly, the length of the diagonal line (passing through the center) in each through hole 63*a* is, for example, 2.3 mm. Such a honeycomb core 63 can be made, for example, by going through an extrusion process of extruding clay (raw material for ceramics) using an extrusion mold, a baking process to bake the extruded clay, and a polishing process to flatten surfaces on both ends of the baked object, using a polishing unit. Or, a honeycomb core shaped object can be made by performing the etching referred to earlier on the surface of the disc shaped ceramic material that has a predetermined thickness, and surfaces on both ends of the honeycomb core shaped object can be polished using a polishing unit to flatten the surfaces.

Referring back to FIG. 2, in the vicinity of the center of main body 26, three through holes are formed (not shown) in a vertical direction (a direction perpendicular to the page surface) with each hole being arranged at a position almost matching the tip of a equilateral triangle, in a state where the holes do not mechanically interfere with pins 32. To each of the through holes, vertical movement pins (center-up) 34*a*, 34*b*, and 34*c* that have a cylindrical shape are inserted, respectively. The three center-ups 34*a*, 34*b*, and 34*c* can be elevated only at the same time by the same amount in the vertical direction (the Z-axis direction), via a vertical movement drive mechanism (not shown) that make up wafer stage drive section 24 in FIG. 1. When the wafer is loaded or unloaded, which operation will be described later, wafer W can be supported from below by center-ups 34*a* to 34*c* or can be driven in the vertical direction in the supported state, since center-ups 34*a* to 34*c* are driven by the vertical movement drive mechanism.

Incidentally, in the embodiment, three vertical movement pins are used when loading and unloading the wafer. The loading and unloading, however, can be performed without using the vertical movement pins. For example, the loading and unloading may be performed by: forming a pair of grooves that are arranged apart in the X-axis direction at a distance almost the same as the diameter of rim portion 28 and extend in the Y-axis direction on a surface of Z tilt stage 30, as well as forming a total of three notches for hooks on rim portion 28 structuring holder main body 70 at positions facing the pair of grooves (one notch arranged at a position facing one groove, and two notches arranged at positions facing the other groove); moving the holder main body (the wafer holder) and a carriage arm for loading or unloading relatively in the Y-axis direction, so that three hooks arranged apart in the X-axis direction at a distance almost the same as the diameter of rim portion 28 on a lower end portion of the carriage arm are inserted or withdrawn from the pair of grooves; and moving the holder main body and the carriage arm for loading or unloading relatively in the Z-axis direction, so that each of the three hooks are inserted into the grooves, or withdrawn from the grooves and the holder main body via the notches that correspond to the hooks.

Figure 2:
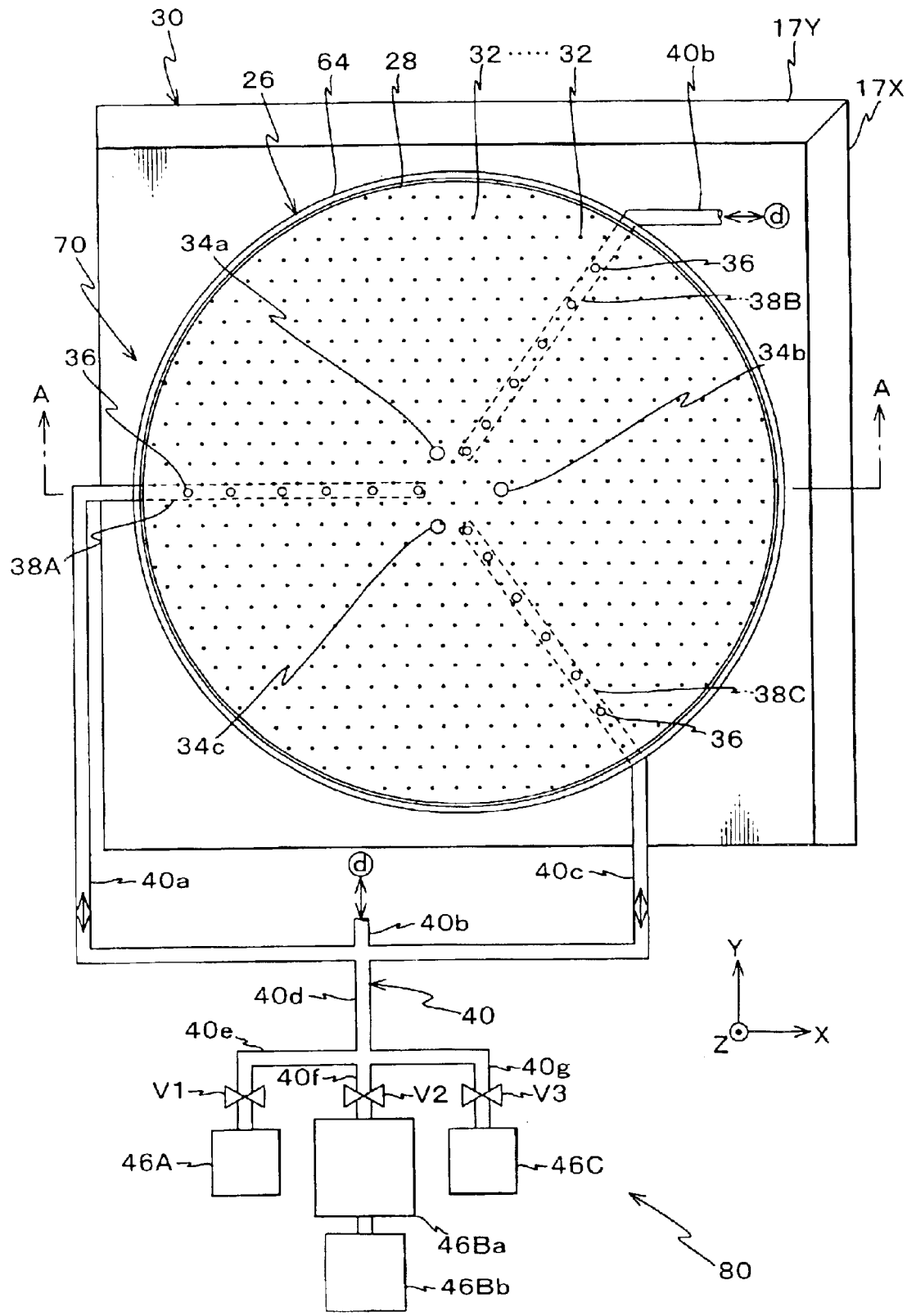
FIG. 2 is a planar view showing the holder main body in FIG. 1 and a gas supply/exhaust mechanism.

In addition, on the upper surface of main body 26, as is shown in FIG. 2, a plurality of gas supply/exhaust openings 36 are formed from around the center of main body 26 along a radial direction (in directions of three radii, spaced with the angle at center around 120°) at a predetermined interval. Gas supply/exhaust openings 36 are also formed at positions where the openings do not mechanically interfere with pins 32. And, gas supply/exhaust openings 36 are formed in a state connected to gas supply/exhaust branch piping 40*a*, 40*b*, and 40*c* that make up a gas supply/exhaust mechanism 80, which is connected to the outer periphery surface of main body 26 and will be described later, via gas supply/exhaust routes 38A, 38B, and 38C.

Figure 6:
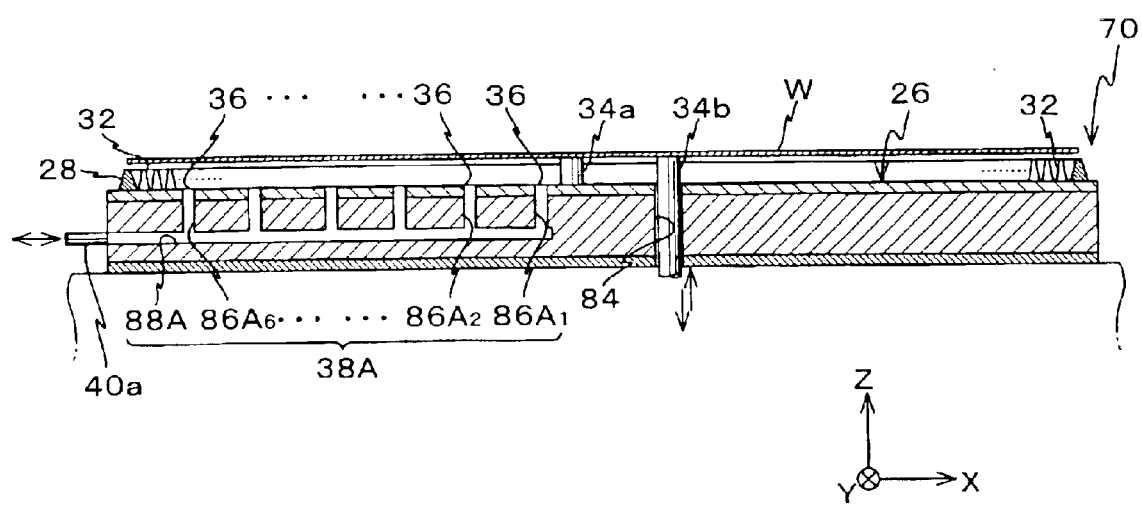
FIG. 6 is a sectional view of a main body of holder main body.

Following is a brief description on gas supply/exhaust routes 38A to 38C, focusing representatively on the details of gas supply/exhaust route 38A referring to FIG. 6, which is a sectional view of line A—A in FIG. 2. Gas supply/exhaust route 38A is a passage made up of a stem path 88 that is formed along the radial direction (in the X-axis direction) from the outer periphery surface of main body 26 (to be more precise, honeycomb core 63) toward the center of main body 26 and a plurality of branches (in this case 6) $86A_1$ to $86A_6$ that are branched in the +Z direction from stem path 88 along the radial direction at a predetermined interval. In this case, opening ends on the upper end of each of the branches 86A1 to 86A6 are gas supply/exhaust openings 36. The remaining gas supply/exhaust routes 38B and 38C are also structured similarly, as with gas supply/exhaust route 38A.

As is shown in FIG. 2, gas supply/exhaust mechanism 80 is connected to holder main body 70 having the structure described above. The mechanism includes a vacuum chucking mechanism, which serves as a suction mechanism for holding wafer W, which is mounted on holder main body 70 and supported by the plurality of pins 32 and rim portion 28 from below, with respect to each of the upper surface (upper end portion) of the plurality of pins 32 and rim portion 28.

Gas supply/exhaust mechanism 80 comprises: a first vacuum pump 46A; a vacuum chamber 46Ba; a second vacuum pump 46Bb; a supply unit 46C; and a gas supply/exhaust piping 40 which connects each of the first vacuum pump 46A, vacuum chamber 46Ba, the second vacuum pump 46Bb, and supply unit 46C to gas supply/exhaust routes 38A to 38C.

Gas supply/exhaust piping 40 is made up of a gas supply/exhaust main piping 40*d*, gas supply/exhaust branch piping 40*a*, 40*b*, and 40*c* that are branched from one end of gas supply/exhaust main piping 40*d*, a first exhaust branch piping 40*e*, a second exhaust branch piping 40*f*, and a supply branch piping 40*g* that are branched from the other end of gas supply/exhaust main piping 40*d*.

To the end of the first exhaust branch piping 40*e* opposite to the gas supply/exhaust main piping 40*d*, the first vacuum pump 46A is connected via an electromagnetic valve (magnetic valve) V1. And, to the end of the second exhaust branch piping 40*f* opposite to the gas supply/exhaust main piping 40*d*, one side of vacuum chamber 46Ba is connected via an electromagnet valve V2. On the other side of vacuum chamber 46Ba, the second vacuum pump 46Bb is connected. In addition, to the end of the supply branch piping 40*g* opposite to the gas supply/exhaust main piping 40*d*, supply unit 46C is connected via an electromagnetic valve V3.

In addition, although it is omitted in the drawings, a barometer is connected to a part of gas supply/exhaust main piping 40*d* in order to measure the pressure within gas supply/exhaust piping 40. The measurement values of the barometer is sent to main controller 20 shown in FIG. 1, and main controller 20 controls the state of electromagnetic valves V1 to V3, and the operation of vacuum pumps 46A and 46Bb and supply unit 46C, based on the measurement values and information related to controlling the load/unload of the wafer. These operations will be further described, later in the description.

Referring back to FIG. 1, XY stage 31 is structured so that it can move not only in the scanning direction (the Y-axis direction), but also in a non-scanning direction (the X-axis direction), which is perpendicular to the scanning direction, so as to position a plurality of shot areas on the wafer at an exposure area conjugate with the illumination area with reference to projection optical system PL. XY stage 31 performs step-and-scan operations, which is a repetition of scanning exposure operation on each of the shot areas on wafer W and stepping operation to move the wafer to the acceleration starting position of the following shot area to be exposed.

The position of wafer stage WST in the XY plane (including rotation around the Z-axis ($\theta z$ rotation)) is detected at all times with a wafer laser interferometer system 18 via a movable mirror 17 provided on the upper surface of Z tilt stage 30, at a resolution of, for example, 0.5 to 1 nm. In actual, on Z tilt stage 30, an X movable mirror 17X that has a reflection surface perpendicular to the non-scanning direction (the X-axis direction) and a Y movable mirror 17Y that has a reflection surface perpendicular to the scanning direction (the Y-axis direction) are arranged, as is shown in FIG. 2. And corresponding to these movable mirrors, an X interferometer that irradiates an interferometer beam perpendicularly onto X movable mirror 17X and a Y interferometer that irradiates an interferometer beam perpendicularly onto Y movable mirror 17Y are provided in wafer laser interferometer system 18. However, in FIG. 1, these parts are representatively shown as movable mirror 17 and wafer laser interferometer system 18. Incidentally, X interferometer and Y interferometer of wafer laser interferometer system 18 are both multi-axis interferometers that have a plurality of length measurement axes, and with these interferometers, rotation (yawing ($\theta z$ rotation, which is rotation around the Z-axis), pitching ($\theta x$ rotation, which is rotation around the X-axis), and rolling ($\theta y$ rotation, which is rotation around the Y-axis)) of wafer stage WST (or to be more precise, Z tilt stage 30) can be also measured, besides the X and Y positions. Incidentally, for example, edge surfaces of Z tilt stage 30 may be polished so as to form reflection surfaces (correspond to the reflection surfaces of mirrors 17X and 17Y). In addition, the multi-axis interferometer may detect relative positional information on projection optical system PL in the direction of optical axis AX (the Z-axis direction) by irradiating a laser beam on a reflection surface provided on a base (not shown) on which projection optical system PL is mounted, via a reflection surface that has a tilt of 45° arranged on Z tilt stage 30.

Positional information (or velocity information) of wafer stage WST is sent to main controller 20, via stage control unit 19. Stage control unit 19 controls the wafer stage WST via wafer stage drive section 24 according to instructions from main controller 20, based on the above positional information (or velocity information) on wafer stage WST.

In exposure apparatus 100 in the embodiment, as is shown in FIG. 1, a focal position detection system is arranged. This system is a multiple focal position detection system based on the oblique incident method that has a light source which on/off operation is controlled by main controller 20, an irradiation system 60*a* which irradiates many image forming lights to an image forming surface of projection optical system PL from a direction incident by a predetermined angle with respect to the optical axis AX so as to form pinhole or slit images, and a photodetection system 60*b* which photo-detects the image forming lights reflected off the wafer W surface. A detailed configuration of a multiple focal position detection system similar to the focal position detection system in the embodiment (60*a* and 60*b*) is disclosed in, for example, Japanese Patent Laid-open 06-283403 and the corresponding U.S. Pat. No. 5,448,332. The disclosure in the above U.S. patent is fully incorporated herein by reference.

Under the instructions of main controller 20, stage control unit 19 controls the movement of Z tilt stage 30 and holder main body 70 in the Z-axis direction and their two dimensional inclination (that is, rotation in the $\theta x$ and $\theta y$ directions) via wafer stage drive section 24, so that defocus is nulled during scanning exposure which will be described later, based on defocus signals from photodetection system 60*b*, such as an S-curve signal. That is, by controlling the movement of Z tilt stage 30 and holder main body 70 using the focal position detection system (60*a* and 60*b*), auto focus (automatic focusing) and auto leveling are performed to substantially make the image forming plane of projection optical system PL coincide with the surface of wafer W within the irradiation area of illumination light IL (the exposure area referred to earlier having an image forming relation with the illumination area). That is, in the embodiment, main controller 20, stage control unit 19, and wafer stage drive section 24 make up a drive unit that drives holder main body 70 in the direction of optical axis AX and in the direction of inclination with respect to a plane perpendicular to the optical axis.

Next, following is a description of operations performed by the exposure apparatus in the embodiment during loading and unloading of wafer W with respect to holder main body 70.

On loading wafer W, electromagnetic valves V1 to V3 in FIG. 2 are all closed, and air supply operation and exhaust operation by gas supply/exhaust mechanism 80 are turned off.

When wafer W is carried to a position above holder main body 70 by a wafer loader (not shown), stage control unit 19 drives center-ups 34*a* to 34*c* upward via the vertical movement drive mechanism (not shown), under the instructions from main controller 20. And, when center-ups 34*a* to 34*c* have been driven upward a predetermined amount, wafer W on the wafer loader (carriage arm for loading) is delivered to center-ups 34*a* to 34*c*, and then the wafer loader is withdrawn from above holder main body 70. Stage control unit 19 then lowers center-ups 34*a* to 34*c* so as to mount wafer W on holder main body 70.

After wafer W is mounted on holder main body 70 in the manner described above, main controller 20 opens electromagnetic valve V2, as is shown in FIG. 2, which is connected to vacuum chamber 46Ba provided for rapid exhaustion, and rapidly suctions (exhausts) gas in the space enclosed with base portion 64, rim portion 28, and wafer W. In the embodiment, in order to improve throughput, the suction pressure is set high (to a high vacuum state) at, for example, around −800 hPa, with the usage of vacuum chamber 46Ba.

Thus, wafer loading is completed, by holding wafer W by suction at a high speed in the manner described above. Main controller 20 then closes electromagnetic valve V2 in FIG. 2, and opens electromagnet valve V1, which is connected to the first vacuum pump 46A that is used under normal conditions. And, from then onward, wafer W is held by suction by the suction force of the first vacuum pump 46A.

Until wafer W is removed after it is held by suction on holder main body 70, the suction pressure (adsorption) necessary only has to be at a level where wafer W does not shift sideways such as by the movement of wafer stage WST, so as to cause an adverse effect on alignment precision or the like. In the embodiment, to keep wafer W from deforming by vacuum chucking as much as possible, the suction pressure of the first vacuum pump 46A that is normally used is set low (to a low vacuum state) at around, for example, −266.5 hPa to −333.2 hPa. In addition, by changing the suction pressure when wafer W is being mounted on holder main body 70 and when other operations are performed, the time required for wafer loading can be reduced.

Meanwhile, on unloading wafer W, first of all, main controller 20 closes electromagnetic valve V1 in FIG. 2, and shuts down the suction operation. Main controller 20 then moves center-ups 34a to 34c upward, as well as open electromagnetic (supply) valve V3, which makes gas blow against the bottom surface of wafer W. With this operation, the vacuumed state described above is immediately released.

When center-ups 34a to 34c are driven upward by a predetermined amount, wafer W supported by pins 32 and rim portion 28 is delivered to center-ups 34a to 34c. A wafer loader (carriage arm for unloading, not shown) is inserted underneath wafer W, and when center-ups 34a to 34c are driven downward wafer W is delivered from center-ups 34a to 34c to the wafer loader. And, then the wafer loader withdraws from above holder main body 70, which completes the unloading operation of wafer W.

As is described, when wafer W is unloaded from holder main body 70, by blowing gas against the bottom surface of wafer W, the time required for unloading the wafer is reduced.

When light such as vacuum ultraviolet light is used as illumination light IL, gas in the optical path of the illumination light is replaced with high permeable gas to the illumination light, such as helium. In such a case, the gas blowing against the bottom surface of the wafer is preferably a high permeable gas to the illumination light (such as, the same gas as the one supplied to the optical path of the illumination light). In addition, the amount of gas blowing against the bottom surface of the wafer is preferably an extremely small amount, so as to keep the wafer from floating.

As is obvious from the description so far, holder main body 70 and gas supply/exhaust mechanism 80 make up a substrate holding unit. In addition, the first vacuum pump 46A, electromagnetic valve V1, gas supply/exhaust piping 40, and gas supply/exhaust routes 38A to 38C make up a vacuum chucking mechanism, which serves as a suction mechanism.

With exposure apparatus 100 in the embodiment, similar to general scanning steppers, exposure operation based on a step-and-scan method is performed in the following manner, after predetermined preparatory operations such as reticle alignment, base line measurement with an alignment system (not shown), and wafer alignment such as EGA (Enhanced Global Alignment) are performed. Details on preparatory operations such as the reticle alignment and base line measurement are disclosed in, for example, Japanese Patent Laid-open 07-176468 and the corresponding U.S. Pat. No. 5,646,413. In addition, details on the following operation, EGA, are disclosed in, for example, Japanese Patent Laid-open 61-44429 and the corresponding U.S. Pat. No. 4,780,617. The disclosures in the above U.S. patents are fully incorporated herein by reference.

More particularly, stage control unit 19 moves wafer stage WST via wafer stage drive section 24 under the instructions from main controller 20 based on wafer alignment results, so that wafer W is positioned at an acceleration starting point for exposing a first shot area (a first shot) subject to exposure on wafer W, which is held on holder main body 70. Then, stage control unit 19 relatively begins to scan (moving synchronously) reticle stage RST and wafer stage WST in the Y-axis direction via reticle stage drive section and wafer stage drive section 24 (both of them not shown), and performs scanning exposure on the first shot area of wafer W so as to reduce and transfer the circuit pattern of reticle R onto the first shot area via projection optical system PL.

When the above scanning exposure is performed, the exposure needs to be performed within the exposure area on which illumination light IL is irradiated, in a state where the surface (of each shot area) of wafer W substantially coincides with the image forming plane of projection optical system PL. Therefore, main controller 20 performs auto focusing and auto leveling, based on the output of the focal position detection system (60a and 60b) previously described.

After scanning exposure on the first shot area is completed in the above manner, under the directions of main controller 20, stage control unit 19 steps wafer stage WST in the X-axis direction via wafer stage drive section 24 so as to move the wafer to the acceleration starting position for exposure on the second shot area. And, under the control of main controller 20, scanning exposure on the second shot area is performed in a similar manner as above.

Thus, scanning exposure on the shot areas on wafer W and stepping operation in between shot areas are repetitively performed, and the circuit pattern of reticle R is sequentially transferred onto all the shot areas on wafer W subject to exposure.

As is obvious from the description so far, in the embodiment, reticle stage drive section, wafer stage drive section 24 (both of which are not shown), and stage control unit 19 make up a synchronous drive unit that drives reticle stage RST and wafer stage WST synchronously in the scanning direction.

As is described in detail so far, in the embodiment, on the upper surface of main body 26 that makes up holder main body 70, the plurality of pins 32 protrude with each of the tip portion arranged almost flush with one another. And, on the area outside pins 32, rim portion 28 is arranged enclosing the area where pins 32 are arranged, with its upper end surface set almost flush with the tip portions of pins 32. Thus, wafer W is supported by the plurality of pins 32 and rim portion 28, so that its flatness is maintained. And, with the vacuum chucking mechanism, wafer W supported on the tips of the plurality of pins 32 and the tip portion of rim portion 28, is vacuum chucked.

In addition, main body 26 is configured of a honeycomb sandwich structure in which the honeycomb core 63 is sandwiched in between the first member 61 making up the surface layer on the upper surface side (one surface) and the second member 62 making up the surface layer on the lower surface side (the other surface). In this case, in honeycomb core 63, the plurality of hollow portions 63a are formed that can decrease the weight of honeycomb core 63.

In addition, since the plurality of hollow portions 63a are arranged in honeycomb core 63 corresponding one by one with the plurality of pins 32, the plurality of hollow portions 63a provided in honeycomb core 63 hardly affect the supporting functions of the plurality of pins 32 for supporting wafer W. Accordingly, in the substrate holding unit including holder main body 70 and the vacuum chucking mechanism (70 and 80), wafer W can be held by suction with the degree of flatness maintained at a high level, and the weight of the substrate holding unit can also be reduced.

In addition, with exposure apparatus 100 related to the embodiment, the substrate holding unit is mounted on wafer stage WST. And, since the weight of the substrate holding unit is reduced, the total weight of the moving portion of the wafer side including the substrate holding unit and the wafer stage is reduced. This allows improvement in the position controllability on wafer stage WST (including wafer W and substrate holding unit). Furthermore, for example, this allows position setting settlement time of wafer stage WST (wafer W) to be reduced during times such as stepping operations or wafer alignment described earlier. In addition, it is also possible to reduce the synchronous settlement time of reticle stage RST and wafer stage WST when acceleration is completed during scanning exposure. Accordingly, throughput can also be improved in the exposure process.

Furthermore, with exposure apparatus 100 in the embodiment, wafer W is held on holder main body 70 with some degree of flatness, that is, in a state without excessive unevenness. Then, the focal position detection system (60a and 60b) detects the position of wafer W related to the Z-axis direction and the tilt with respect to the XY plane, and based on the detection results main controller 20 drives holder main body 70 in the Z-axis direction and in the direction of inclination to the XY plane, via stage control unit 19 and wafer stage drive section 24. That is, focus leveling control is performed on wafer W. With this operation, even when a slight tilt occurs on the wafer, by adjusting the inclination of the entire wafer and its position in the Z-axis direction via holder main body 70, the reticle pattern can be transferred onto the wafer in a state where the surface of the wafer (shot area) almost coincides with the image plane of projection optical system PL. Accordingly, exposure with high precision can be performed, without any degradation of transfer accuracy caused by defocusing.

Figure 7:
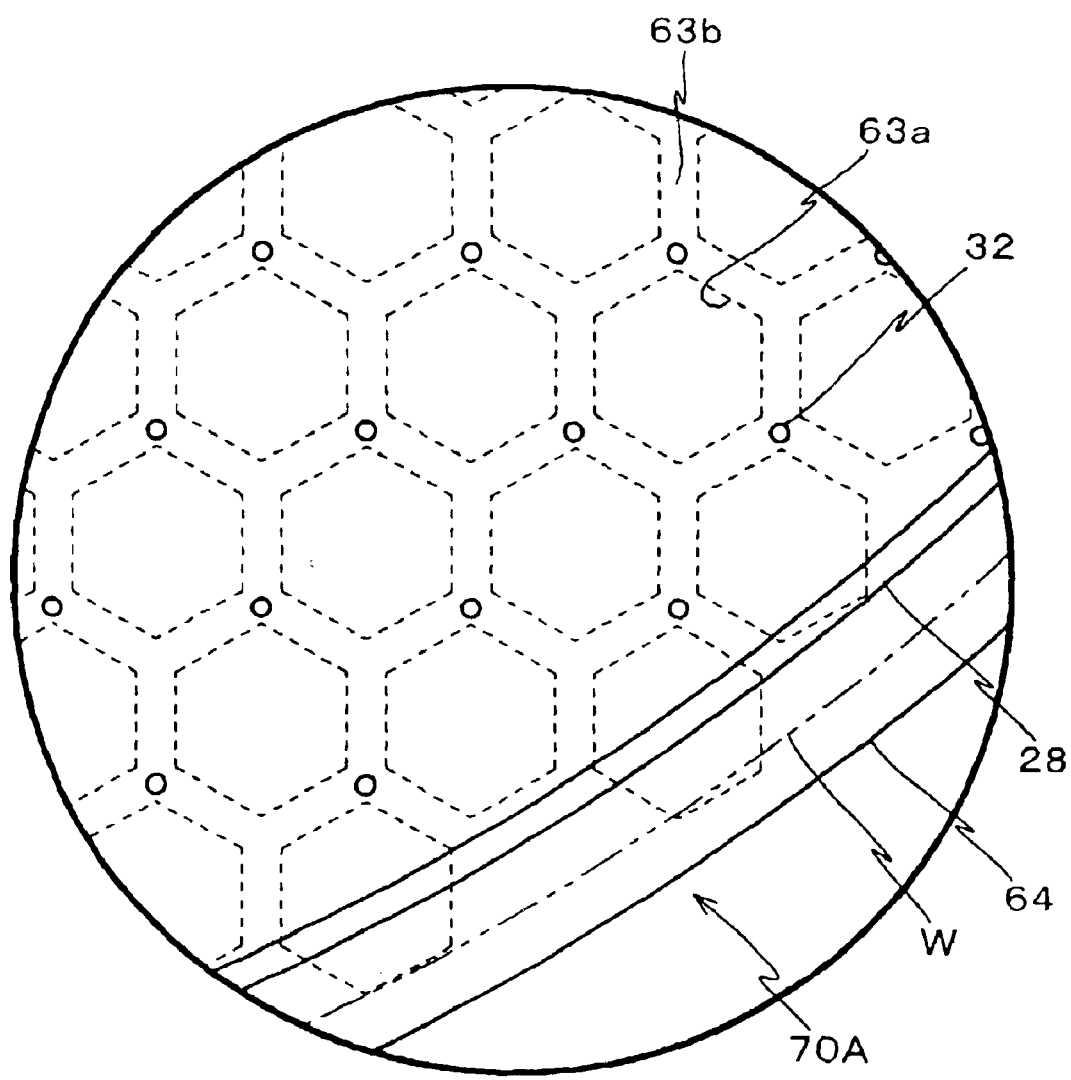
FIG. 7 is a view showing a first modified example of a part of a holder main body.

The arrangement of pins 32 or configuration of the core described in the above embodiment is a mere example, and do not limit the present invention. FIG. 7 is a partial view of a first modified example related to the holder main body. FIG. 7 shows the part corresponding to FIG. 5 referred to earlier. Holder main body 70A related to the modified example shown in FIG. 7 is configured of each of the pins 32 entirely arranged corresponding to a rim portion 63b of honeycomb core 63 at an equal space. Other configurations are the same as is described in the first embodiment. Accordingly, the same effect as the first embodiment can be obtained with the first modified example.

Figure 8:
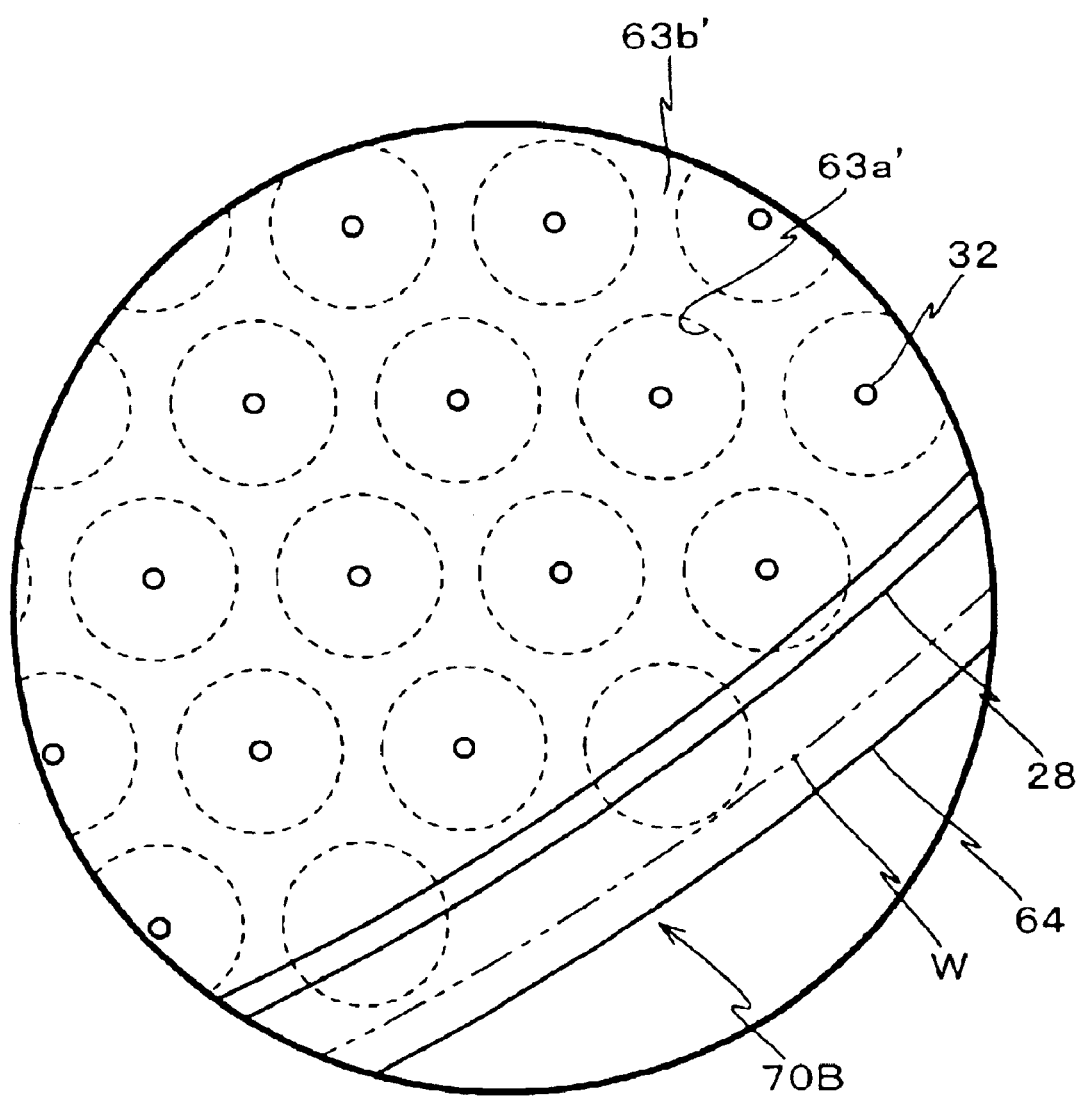
FIG. 8 is a view showing a second modified example of a part of a holder main body.

In addition, FIG. 8 shows a partial view of a second modified example related to the holder main body. FIG. 8 shows the part corresponding to FIG. 5 referred to earlier. With holder main body 70B related to a modified example shown in FIG. 8, instead of honeycomb core 63 that configures main body 26 of holder main body 70 as is previously described, a core member in which circular openings 63a' are formed corresponding one by one with the arrangement of pins 32 with an equal space is used in a sandwich structure as the holder main body. Other configurations are the same as the first embodiment described above. Accordingly, the same effect as the first embodiment can be obtained also with the second modified example.

Figure 9:
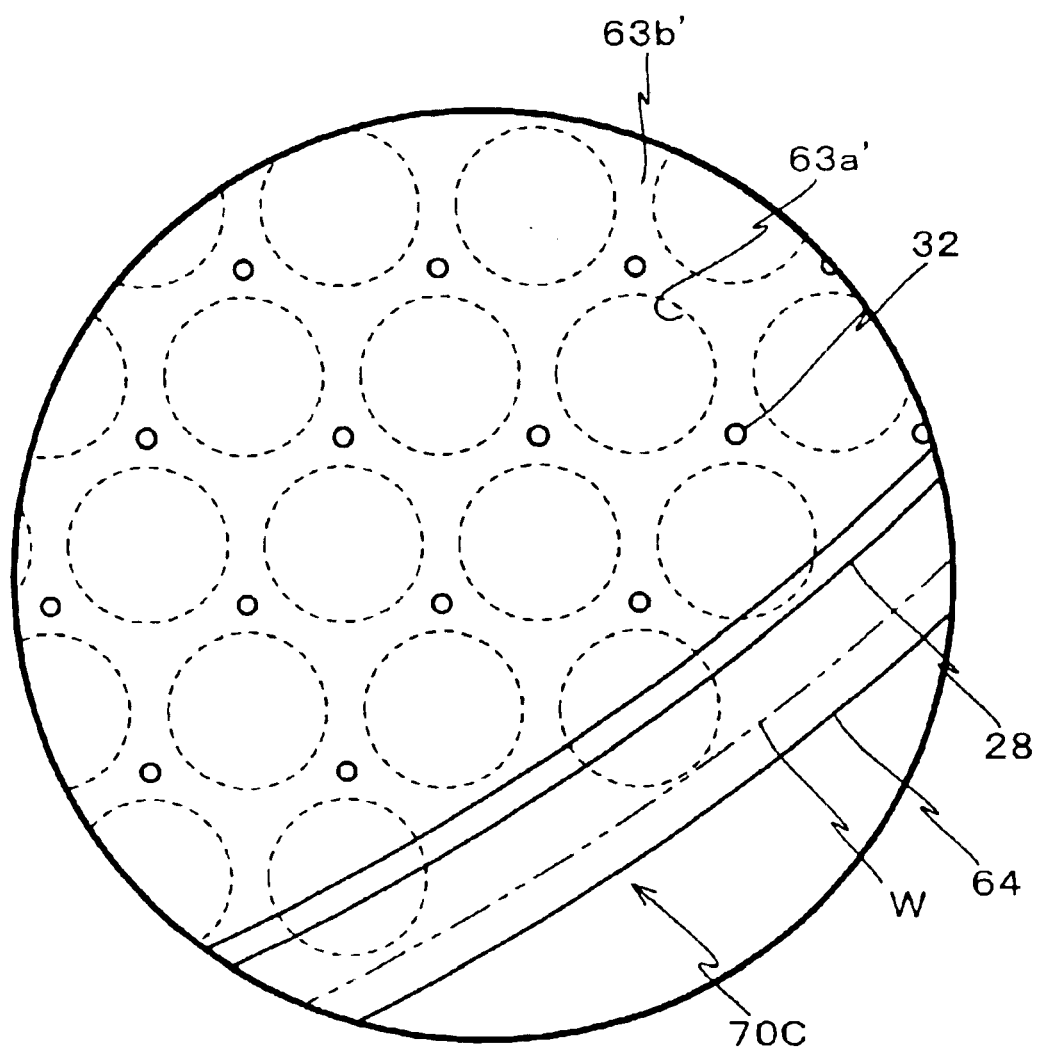
FIG. 9 is a view showing a third modified example of a part of a holder main body.

In addition, FIG. 9 shows a partial view of a third modified example related to the holder main body. FIG. 9 shows the part corresponding to FIG. 5 referred to earlier. Holder main body 70C related to the modified example shown in FIG. 9 is configured of each of the pins 32 entirely arranged corresponding to a rim portion 63b' of a core member with an equal space. Other configurations are the same as is described in the first embodiment. Accordingly, the same effect as the first embodiment can be obtained also with the third modified example.

The same effect as the embodiment previously described can be obtained when mounting the holder main body related to the above first to third modified examples on wafer stage WST, instead of holder main body 70.

In the above embodiment and the modified examples, through holes of a hexagonal or circular shape of the same area are formed in the core member at a certain space. The present invention, however, is not limited to this. For example, the core member does not necessarily require a through hole, and a hole that has an opening on only one surface may be provided as a hollow portion (hollow space). In addition, the area (size) of each hollow space does not necessarily have to be entirely equal. For example, when optimizing the contact ratio of pins 32 and rim portion 28, it is confirmed by the experiments performed by the present inventor that pins 32 are better arranged sparsely near the center of the main body and densely in the vicinity of the rim portion (the details are described later in the description). Accordingly, to correspond with the optimum arrangement of pins 32, the hollow portions provided in the core may be large (a large area) near the center of the main body and small (a small area) in the vicinity of the rim portion. In addition, instead of changing the size (area) of the hollow portions depending on the position where the hollow portions are formed in the main body, the space in between the hollow portions may be changed depending on its position, or a combination of both may be considered. In short, the hollow portions of the core only need to be formed in an arrangement so that there is some kind of a corresponding relation with the arrangement of the pins. Since the core is made by extrusion molding and baking, such configuration can be easily achieved.

Second Embodiment

Next, a second embodiment of the present invention is described, referring to FIGS. 10 to 12B. Structures and components identical or equivalent to those described in the first embodiment are designated with the same reference numerals, and the description thereabout is briefly made or is entirely omitted.

An exposure apparatus related to the second embodiment has a different configuration of the holder main body when compared with the exposure apparatus in the first embodiment. Other configurations are the same as is described in the first embodiment; therefore, hereinafter the description will focus on the difference.

Figure 10:
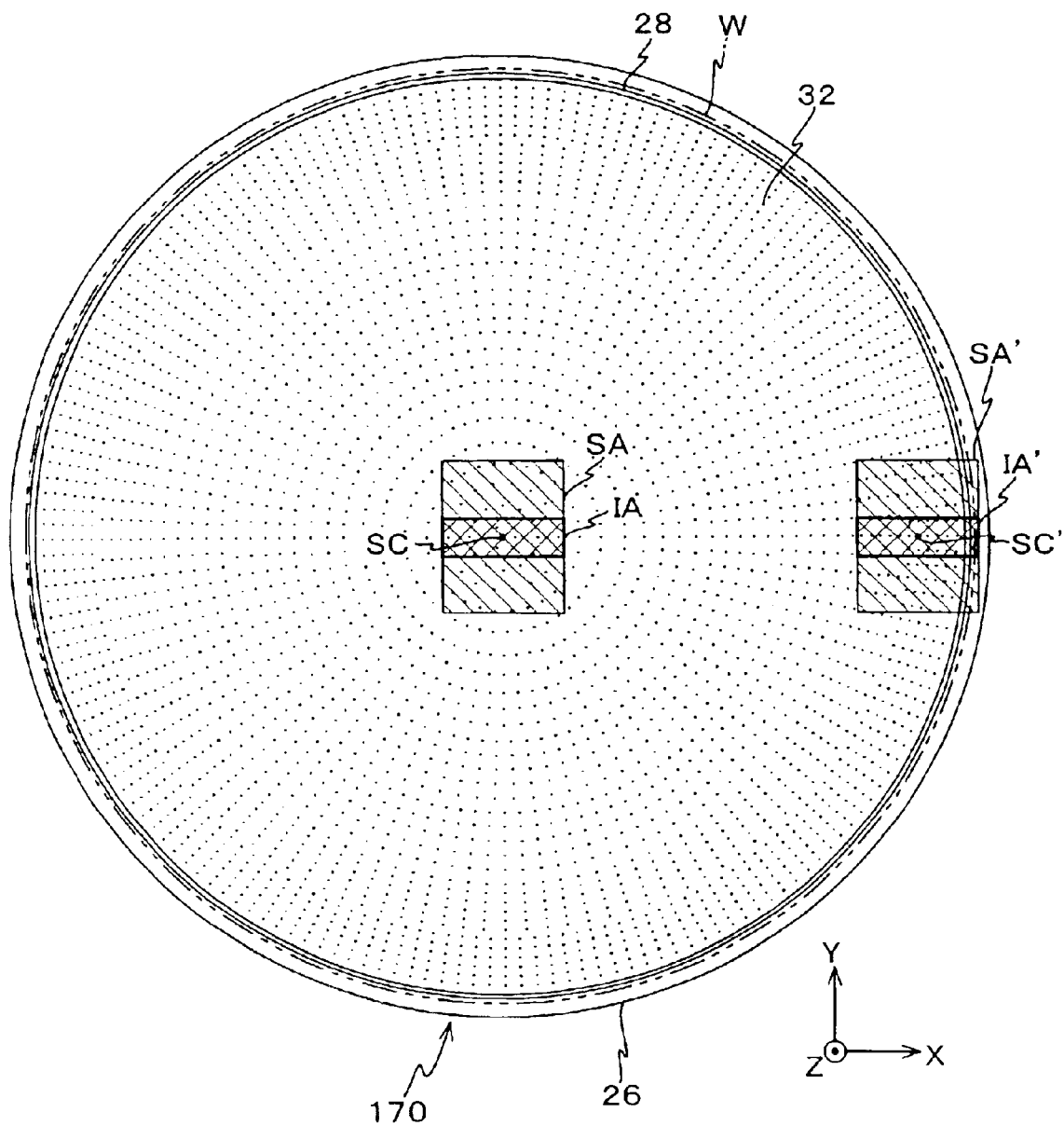
FIG. 10 is a planar view of a holder main body related to a second embodiment in the present invention.

FIG. 10 shows a planar view of a holder main body 170 related to the second embodiment. Holder main body 170 is basically produced in a similar manner with holder main body 70, and has a similar configuration, however differs on the following points.

More specifically, the plurality of pins 32 provided along with rim portion 28 in main body 26 are arranged in multiple rings of concentric circles with the center point being a reference point on main body 26. The space in between the adjacent arcs of the concentric circles is set smaller near rim portion 28 and is wider when approaching the center point. That is, the plurality of pins 32 are arranged so that the space in between adjacent pins 32 is wider when they are located further away from rim portion 28.

Therefore, pins 32 located close to rim portion 28 are densely arranged so that the local contact ratio (to be more precise, the proportion of the contact surface area between the pins 32 and the rear surface of wafer W, in a unit area of a predetermined area) is extremely close to the local contact ratio of rim portion 28 (to be more precise, the proportion of the contact surface area between the rim portion 28 and the rear surface of wafer W in the above unit area). In addition, in the entire holder main body 170, the number of pins 32, the area of the tip surface (upper tip surface), the shape of the upper tip surface of rim portion 28, and the like are set so that the total area of the contact surface area between the upper surface of rim portion 28 and the rear surface of wafer W falls below 20% of the contact surface area between rim portion 28, pins 32, and the rear surface of wafer W.

In addition, in the second embodiment, although it is omitted in the drawings, the hollow openings provided in the core are formed to be larger around the center of main body 26, and smaller close to the rim portion 28.

Next, the reasons for pins 32 having such an arrangement in holder main body 170 in the second embodiment are described, referring to FIGS. 11A to 12A.

Figure 11A:
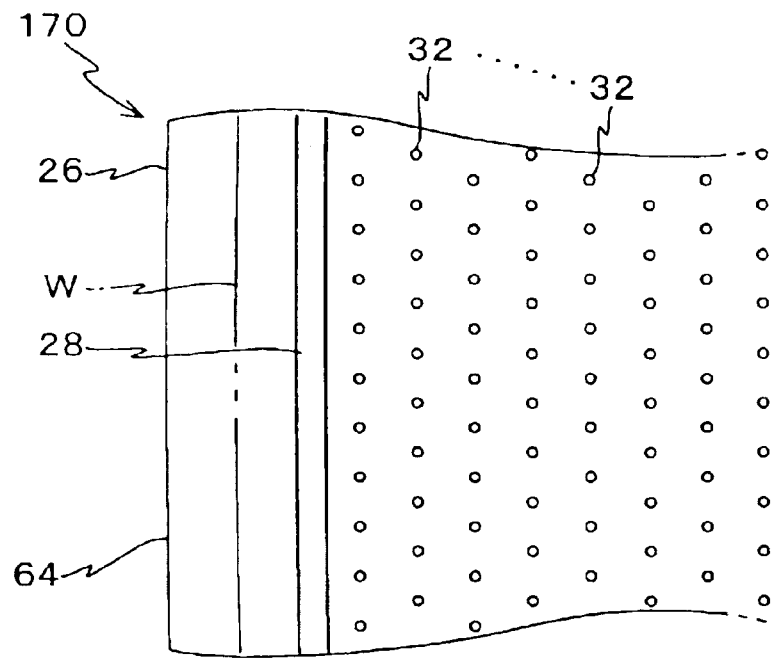
FIG. 11A is an enlarged planar view of an area around a rim portion (in the vicinity of the outer periphery portion) of the holder main body in FIG. 10.
Figure 11B:
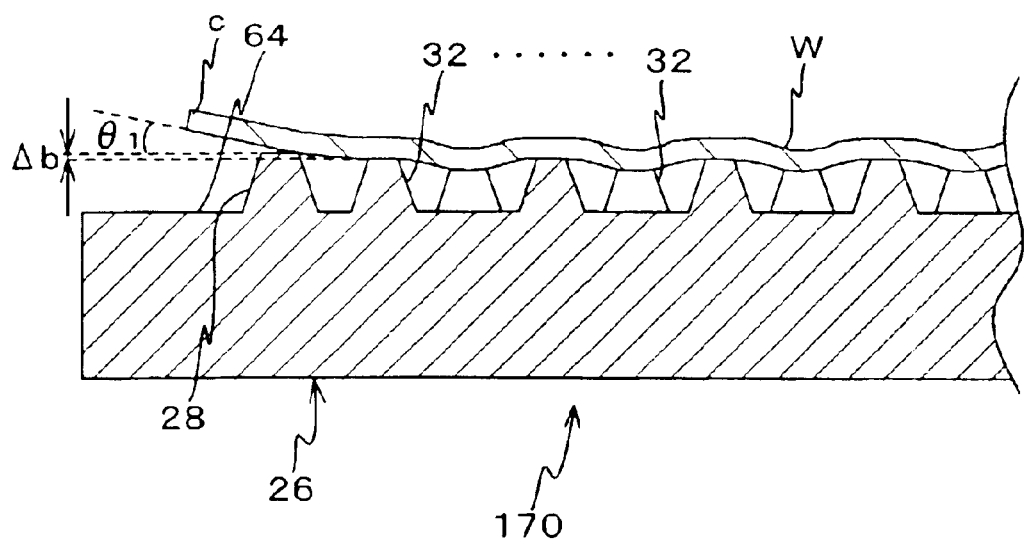
FIG. 11B is a view modeled in section of an area around a rim portion of the holder main body in FIG. 10.

First of all, the reason for narrowing the space in between pins 32 located near rim portion 28 and nearing the local contact ratio of the pins near rim portion 28 to the local contact ratio of rim portion 28 is described, referring to FIGS. 11A and 11B. FIG. 11A is an enlarged planar view showing an area around an outer periphery portion of holder main body 170, and FIG. 11B is a view modeled on holder main body 170 in FIG. 11 in a longitudinal sectional surface, holding wafer W by suction.

Figure 18A:
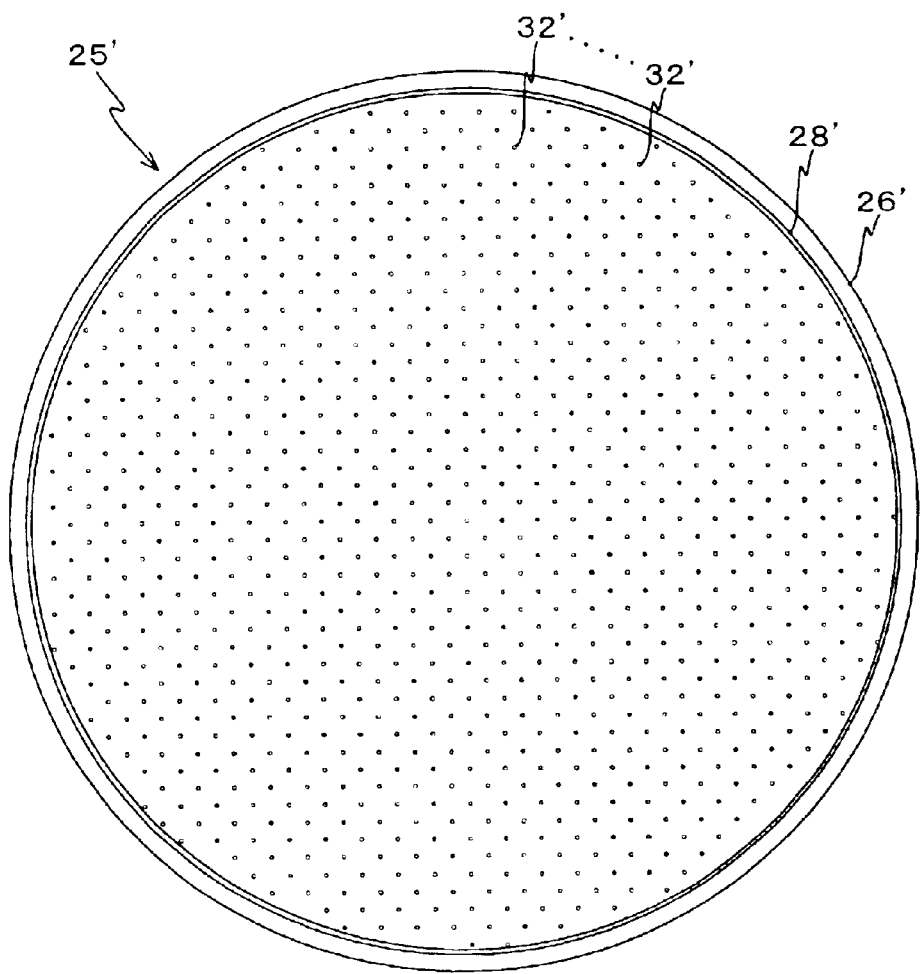
FIG. 18A is a planar view of a wafer holder in a prior art.
Figure 18B:
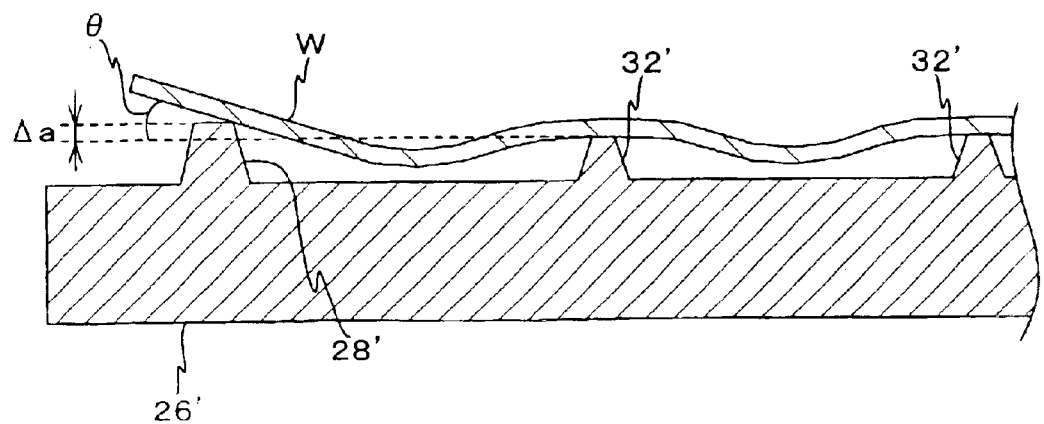
FIG. 18B is an end view of the wafer holder in FIG. 18A in a longitudinal section, on which a wafer is mounted.

As is described above, when making holder main body 170, in order to secure the flatness of the surface set by the upper tip portions of pins 32 and the upper surface of rim portion 28, the upper tip portions and the upper surface are polished after pins 32 and rim portion 28 are formed on base portion 64 of the first member 61 making up the main body 26. When the polishing process is performed, since the local contact ratio of the pins is made to closely match the local contact ratio of rim portion 28 in the embodiment, the difference between the contact pressure of the polishing portion (processing portion) with respect to rim portion 28 during polishing and that of the polishing portion (processing portion) with respect to the pins close to the rim portion can be decreased. Therefore, a processing step Δb of pins 32 and rim portion 28 shown in FIG. 11B can be made smaller than processing step Δa of pins 32' and rim portion 28' in the conventional wafer holder 25' that is shown in FIG. 18B.

Since rim portion 28 also serves as a seal member for maintaining the vacuumed state between wafer W and main body 26 (base portion 64), the part of the wafer located on the outer side of rim portion 28 is under atmospheric pressure. Therefore, the outer periphery portion of wafer W (portion c) is a free edge. In this case, the height of the outer periphery portion of wafer W depends on an angle θ₁, which is set by two physical quantities; processing step Δb, and the deformation amount of wafer W due to vacuum chucking. More precisely, as is shown in FIG. 11B, with holder main body 170 in the second embodiment which processing step Δb of pins 32 and rim portion 28 is set at a small value, the height of the outer periphery portion of wafer W (portion c), which is held on holder main body 170, can be set low. Accordingly, by narrowing the space in between pins 32 close to rim portion 28 to near the local contact ratio of the pins close to rim portion 28 to the local contact ration of rim portion 28, factors that trigger defocusing during exposure on shot areas close to the outer periphery portion of wafer W can be eliminated, or suppressed.

Figure 12A:
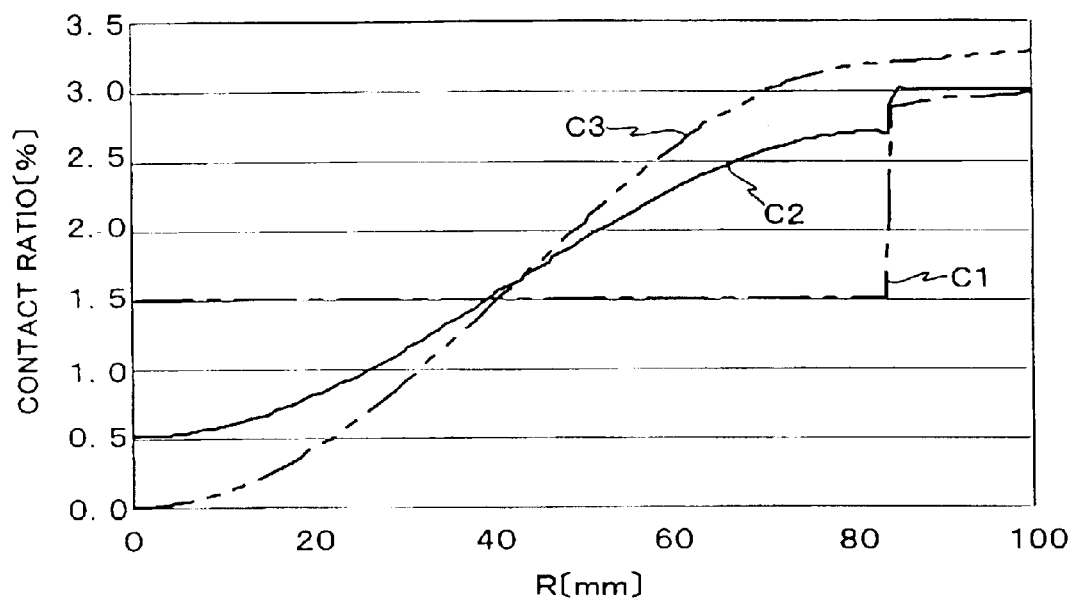
FIGS. 12A and 12B are views for describing the effects of a pin arrangement in a holder main body.

Next, the reason for setting the space in between adjacent pins 32 wide around the center of main body 26 and narrow close to rim portion 28 in the embodiment is described, referring to FIG. 12A.

FIG. 12A shows a diagram modeled on a change of the contact ratio of an area on the rear surface of wafer W to holder main body 170 (pins 32 and rim portion 28), when presumed that the area, which is the same as shot area SA shown in FIG. 10 on the rear surface of wafer W, is moved in the +X direction to the position of shot area SA'. In FIG. 12A, curve C1 drawn in a dotted line shows the change in contract ratio of the holder main body when pins 32 are arranged equally spaced, as in the conventional manner (refer to FIG. 18A) (hereinafter referred to as "constant pin arrangement" as appropriate) On the other hand, curve C2 drawn in a solid line shows the change in contract ratio of the holder main body when pins 32 are arranged widely spaced around the center of the upper surface of main body 26 and are dense when approaching rim portion 28, as in the second embodiment (hereinafter referred to as "continuous pin arrangement" as appropriate). In this case, the total contact ratio of the holder main body having the constant pin arrangement shown in curve C1 to the entire wafer and the contact ratio of the holder main body having the continuous pin arrangement shown in curve C2 to the entire wafer are to be almost equal. As wafer W, a SEMI standard 8-inch wafer (diameter around 200 mm) is used, and the transverse axis in FIG. 12A shows the center SC position of shot area SA (refer to FIG. 10).

In FIG. 12A, when focusing on the state where the shot area is located on rim portion 28 (refer to shot area SA' in FIG. 10), more particularly, when focusing on state where the center of the shot area is located approximately 85 mm away from the center of the holder (refer to center SC' of shot area SA' in FIG. 10), the contact ratio rises sharply in the constant pin arrangement shown in curve C1. However, when the continuous pin arrangement is employed as in the second embodiment, as is shown in curve C2 the contact ratio gradually increases, as the center of the shot area moves away from the center of wafer W. Therefore, the contact ratio at the position approximately 85 mm away from the center of the wafer (refer to shot area SA' in FIG. 10) can be suppressed to only a slight increase. Thus, the increase amount of the contact ratio at the position approximately 85 mm away from the center of the wafer is much smaller, compared with when the constant pin arrangement is employed (curve C1).

That is, since the shape of the holder surface changes corresponding to the change in contact ratio due to the nature of the polishing process, by employing the continuous pin arrangement as in the second embodiment, a steep processing step can be kept from forming between rim portion 28 and pins 32.

Therefore, with holder main body 170 employing the continuous pin arrangement (curve C2), the processing step between rim portion 28 and pins 32 can be reduced, with the contact ratio of the entire wafer to holder main body 170 set almost equivalent to the contact ratio in the constant pin arrangement (curve C1). Accordingly, in the wafer mounted on holder main body employing the continuous pin arrangement, deformation on the periphery of the wafer caused by the processing step can be suppressed, without increasing the possibility of a foreign material being clamped in between the wafer and holder main body 170.

In this case, by employing such a continuous pin arrangement, the shape of the surface of holder main body 170 (and wafer W held on holder main body 170) changes moderately than before. Furthermore, since shot area SA is sufficiently small compared to wafer W, and since the height and inclination of the surface of the wafer can be corrected by driving Z tilt stage 30 in the Z-axis direction and in the direction of inclination with respect to the XY plane based on the measurement values of the focal position detection system (60a and 60b) as is previously described, the change in the shape of the surface of the holder main body and the wafer is rarely the cause of defocusing during scanning exposure.

Incidentally, the space of the pins arranged around the center of the holder main body (contact ratio) is set, so that the deformation amount of the wafer is within a permissible range, when the wafer is vacuum chucked.

Curve C3 drawn in a double-dotted line in FIG. 12A shows the contact ratio of a virtual holder main body which rim portion 28 is removed and replaced by pins arranged up to the position where rim portion 28 was supposed to be in the continuous pin arrangement. It is possible, theoretically, to completely eliminate the processing step as is shown in the curve C3, by making the contact ratio of pins 32 located closed to rim portion 28 coincide with that of rim portion 28.

Next, a concrete design method of the width of rim portion 28 in holder main body 170 (hereinafter referred to as "rim width") is described.

When total contact ratio (proportion of the entire area of the contact surface of pins 32, rim portion 28, and wafer W with respect to the entire rear surface area of wafer W) is expressed as ρ, pins contact ratio (proportion of the entire area of the contact surface of pins 32 and wafer W with respect to the entire rear surface area of wafer W) as ρp, radius of the wafer as R mm, and width of the rim portion as b mm, and the error between the pins contact ratio and the total contact ratio is set within 20%, that is, when an area where the rim portion in contact with wafer W is to be set within 20% of an area where the rim portion and the pins are in contact with the wafer, it can be expressed by the following equation:

$$(\rho - \rho p)/\rho \leq 0.2 \qquad (1)$$

In this case, the range within 20% is considered substantially practical by the present inventor, who focused on the area where the plurality of pins are in contact with the wafer, the area where the rim portion is in contact with the wafer, and the area where the plurality of pins and the rim portion are in contact with the wafer (total contact area), and performed various simulations and experiments regarding the relation between these areas and the processing step.

Meanwhile, the diameter of rim portion 28, which also serves as a seal member between wafer W and main body 26 configuring holder main body 170, cannot be set the same as that of the circumference of wafer W. Therefore, when rim portion 28 supposedly supports the wafer 1 mm inside the circumference and the area where the pins contact the wafer is expressed as A, since there is usually a relation b<<R, the total contact ratio ρ can be expressed in the following equation:

$$\rho = \{A + \pi(R-1)^2 - \pi(R-1-b)^2\}/\pi R^2 \approx \{A + 2\pi(R-1)\cdot b\}/\pi R^2 \qquad (2)$$

In addition, the pins contact ratio ρp can be expressed in the following equation:

$$\rho p = A/\pi R^2 \qquad (3)$$

Accordingly, the above equation (1) can be expressed as in equation (4) below, by above equations (2) and (3):

$$(\rho - \rho p)/\rho \approx [\{A + 2\pi(R-1)b\}/\pi R^2 - (A/\pi R^2)]/\rho \leq 0.2 \qquad (4)$$

When equation (4) is re-arranged and modified, it turns out to be expressed as follows:

$$\{2\pi(R-1)\cdot b\}/\pi R^2 \leq 0.2\rho \qquad (4)'$$

That is, by equation (4)', it is obvious that width b of the rim portion is preferably to be within the range expressed in the following equation:

$$b \leq (0.1\rho R^2)/(R-1) \qquad (5)$$

For example, when using the SEMI standard 8 inch wafer (diameter=approximately 200 mm) and the total contact ratio is to be set below 3%, according to the above equation (5), width b of the rim portion is to be in the range determined by the following equation:

$$b \leq (0.1 \times 0.03 \times 100^2)/(100-1) \approx 0.30 \ (mm) \qquad (6)$$

In addition, for example, when using a SEMI standard 12 inch wafer (diameter=approximately 300 mm) under the same conditions, width b of the rim portion is to be in the range determined by the following equation:

$$b \leq (0.1 \times 0.03 \times 150^2)/(150-1) \approx 0.45 \ (mm) \qquad (7)$$

By employing such a design method for the rim portion, by holding the total contact ratio of the holder main body to the wafer below 3%, and by keeping the area where the rim portion is in contact with the wafer within 20% of the entire area where the rim portion and the pins are in contact with the wafer, a good holder can be obtained, in which clamping of foreign materials between the processing step and the wafer is suppressed.

With the exposure apparatus described in the second embodiment so far, in addition to the same effects described in the first embodiment, the following effects can also be obtained.

More precisely, wafer W is supported with the plurality of pins 32 and rim portion 28 of holder main body 170, while it virtually maintains its degree of flatness. In this case, since the plurality of pins 32 are arranged in the manner where adjacent pins are spaced distantly apart when further away from rim portion 28, the local contact ratio of the rim portion to the wafer can be made to near the local contact ratio of the pins close to the rim portion to the wafer, as is described earlier referring to FIG. 12A. Accordingly, with the second embodiment, in the making of holder main body 170, when polishing is performed using polishing units or the like to create the flatness on the surface side of holder main body 170 that makes contact with the wafer, the difference in the contact pressure on each of the rim portion and the pins closed the rim portion from the polishing portion (processing portion) can be reduced, allowing the processing step formed between the rim portion and the pins closed the rim portion to be reduced as much as possible. That is, the processing step formed at the surface where the holder main body is in contact with the wafer can be made extremely small, and as a consequence, deformation formed in the free edge portion close to the circumference of the wafer (angle of inclination) can be reduced.

In addition, with the second embodiment, the area where the rim portion is in contact with the wafer is set so that it is within 20% of the entire area where rim portion 28 and pins 32 are in contact with the wafer. From this point also, as is described earlier, the processing step formed at the surface between each of the pins 32 and rim portion 28 in the polishing process during the making of the holder main body can be made extremely small.

In the above second embodiment, the case is described where pins 32 are arranged at a wider space when further away from rim portion 28, however, the present invention is not limited to this. More particularly, the plurality of pins 32 can be arranged, for example, so that the space of the adjacent pins changes gradually from close to rim portion to the center portion of holder main body 170, and the area in between. In such a case, pins 32 arranged close to rim portion 28 are arranged densely compared with pins 32 arranged at other locations, allowing the local contact ratio of rim portion 28 to the wafer can be made to near the local contact ratio of the pins close to the rim portion to the wafer. Accordingly, similar to the above second embodiment, the processing step formed at the surface between each of the pins 32 and rim portion 28 in the polishing process during the making of the holder main body can be made extremely small, and as a consequence, deformation formed in the free edge portion close to the circumference of the wafer (angle of inclination) can be reduced.

In addition, so long as the pins and the rim portion satisfy the design conditions (that the area of the rim portion making contact with the substrate is within 20% of the entire contact area) and the clamping of foreign materials is within the permissible range (for example, the contact ratio of the wafer and the entire holder main body is below 3%), the pins may be arranged in the constant pin arrangement as is described in the first embodiment. That is, with exposure apparatus 100 described earlier in the first embodiment, it is also preferable for holder main body 70 to satisfy the above design conditions and, for example, keep the contact ratio of the wafer and the entire holder main body below 3%.

Figure 12B:
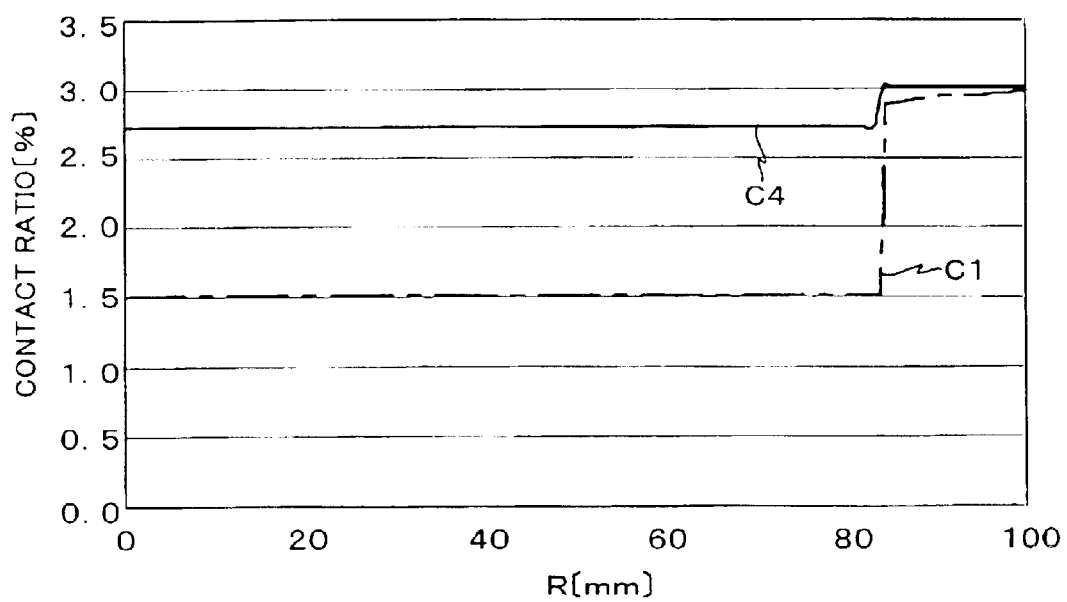

When such an arrangement is employed, the pins and the rim portion are set as in the curve C4 in FIG. 12B, which decreases the processing step at the rim portion compared with the conventional constant pin arrangement (curve C1). Therefore, when such a holder main body holds the wafer, the deformation in the circumference of the wafer can be suppressed. Accordingly, factors that cause defocusing in the circumference of the wafer can be reduced, if not eliminated.

In addition, in the above second embodiment, the case is described where the plurality of pins 32 are arranged in multiple rings of concentric circles with the reference point (center point) on holder main body 170 serving as the center. The present invention, however, is not limited to this and the arrangement of the pins is relatively free, so long as the space around pins 32 located near close to rim portion 28 is small compared with pins 32 arranged in the other parts, and pins 32 arranged in the other parts are spaced so that the deformation of the wafer is within the permissible value.

Third Embodiment

Figure 13A:
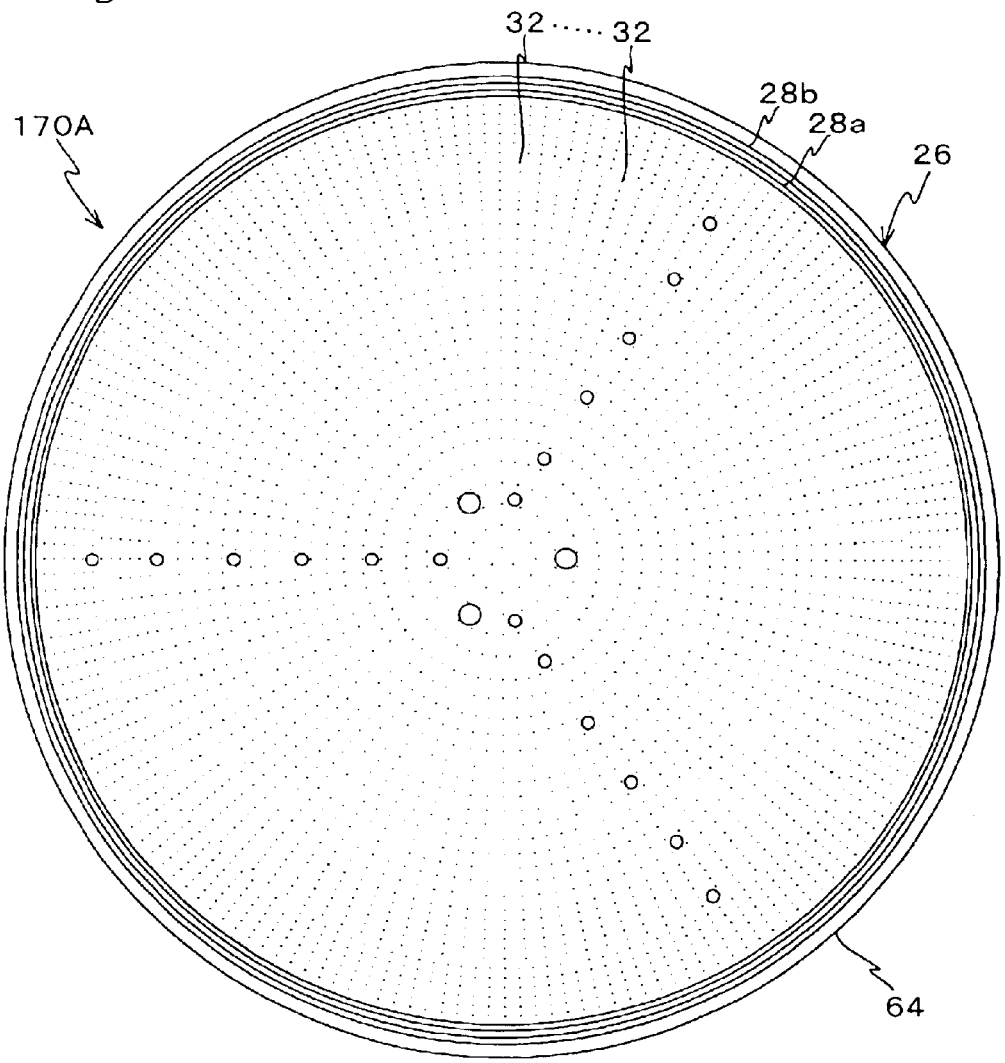
FIG. 13A is a planar view of a holder main body related to a third embodiment in the present invention.
Figure 13B:
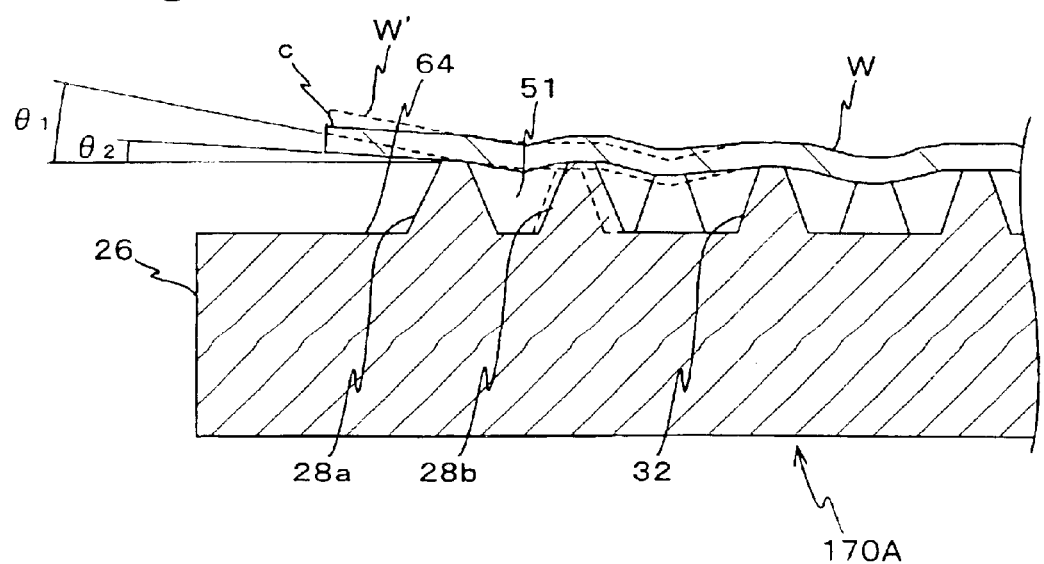
FIG. 13B is a longitudinal sectional view of the holder main body in FIG. 13A in the vicinity of the outer periphery portion.

Next, a third embodiment of the present invention is described, referring to FIGS. 13A and 13B. Structures and components identical or equivalent to those described in the first embodiment and the second embodiment are designated with the same reference numerals, and the description thereabout is briefly made or is entirely omitted.

An exposure apparatus related to the third embodiment has a different configuration of the holder main body when compared with the exposure apparatus in the first embodiment. Other configurations are the same as is described in the first embodiment; therefore, hereinafter the description will focus on the difference.

FIG. 13A shows a planar view of a holder main body 170A related to the third embodiment.

As can be seen from FIG. 13A, in the third embodiment, in the outer periphery of main body 26 configuring holder main body 170A, a double rim portion 28a and 28b are formed. Rim portions 28a and 28b both have the same width, and are arranged in concentric circles with a radius difference of around 1 to 3 mm. In addition, gas in space 51 (refer to FIG. 13B) formed in between rim portions 28a and 28b is suctioned by a gas supply/exhaust mechanism similar to gas supply/exhaust mechanism 80 in the first embodiment via a gas supply/exhaust opening(s) (not shown) formed in between rim portions 28a and 28b on the upper surface of main body 28. Other configurations of holder main body 170A are the same as the holder main body 170 described in the second embodiment.

Next, the reason for arranging two rim portions 28a and 28b on holder main body 170A is described, referring to FIG. 13B, which is a longitudinal sectional view of FIG. 13A.

As is described earlier in the second embodiment, the height of the outer periphery portion of wafer W (portion c) depends on an angle set by two physical quantities; the processing step, and the deformation amount of wafer W due to vacuum chucking.

By making the radius difference approximately 1 to 3 mm in between rim portions 28a and 28b as is described above, the area of rim portions can be considered almost equal. Therefore, the processing speed of each of the rim portions 28a and 28b is almost the same, which practically makes no processing steps between rim portions 28a and 28b. Accordingly, an angle of inclination $\theta_2$ in a free edge of the wafer (portion c) shown in FIG. 13B is caused only by the deformation amount of wafer W due to vacuum chucking.

Therefore, the angle $\theta_2$ can be set smaller than the angle $\theta_1$, which is the angle of inclination in a free edge of the wafer employing a single rim portion arrangement (refer to wafer W' shown in a dotted line in FIG. 13B).

That is, when holder main body 170A having the above arrangement holds wafer W, the deformation (warping) in the outer periphery of the wafer can be suppressed to the utmost. In this case, since the rim portion has a double structure, it can be predicted that the area of the rim portion in contact with the wafer is larger than that of the pins. Therefore, holder main body 170A is preferably designed so that the contact ratio of the pins and the double rim portion satisfies the same conditions described in the second embodiment.

With the third embodiment described so far, in addition to the same effects described in the second embodiment, the deformation in the outer periphery of the wafer can be further suppressed.

In the above third embodiment, the case is described where the rim portion has a double structure. The present invention, however, is not limited to this, and the rim portion may have multiple rings, such as three, four, . . . and so forth. In this case, in order to reduce the contact ratio of the rim portion, the width of the rim portion may gradually be narrowed in the rims located on the inner side, toward the center.

In each of the above embodiments, the case is described where rim portion 28, pins 32, and base portion 64 are integrally molded. As a matter of course, the present invention is not limited to this, and the base portion, the pins (the first support member), and the rim portion (the second support member) can all be made from a separate member, or an arbitrary one can be made separately. In this case, at least either the pins or the rim portion, which is structured separately from the base portion, may be fixed to the upper surface of base portion 64 using an adhesive or the like.

In addition, in each of the above embodiments, the case is described where the wafer (a circular substrate) is used as a substrate. The substrate, however, may be a square or other shapes such as a polygon. In such a case, by setting the shape of the rim portion to match the shape of the substrate, the same effect described in each of the above embodiments can be obtained. In addition, the shape of the base portion (a circular plate shape in the above embodiments) does not have any limitation in particular.

In addition, since the rim portion is generally in continuous contact with the wafer in order to maintain the vacuum state, the local contact ratio tends to be high (that is, the processing speed is slow) with the rim portion project more than the pins. When the area of the rim portion contacting the wafer can be set at a small value, however, a depressed step may be formed at the rim portion. Accordingly, for the same reasons for setting the upper limit so that the area of the rim portion making contact with the substrate is within 20% of the entire contact area in each of the above embodiments, a lower limit is preferably set in the contact ratio of the rim portion.

In each of the above embodiments, the case is described where almost the entire surface of the upper surface of the rim portion is in direct contact with the rear surface of wafer W. The present invention, however, is not limited to this, and a second support may be employed that is a plurality of small projected portions further arranged on the upper end surface of the rim portion. In such a case, since these projected portions form the surface that makes direct contact with the wafer, a gap having the height of the projected portion is formed in between the upper surface of the rim portion and the wafer, which slightly weakens the vacuum suction force. However, since the projected portions form the contact surface, a contact ratio similar to the curve C3 shown in FIG. 12A can be achieved, and the effect of this achievement is extremely large, as is earlier described. When the plurality of projected portions are provided on the upper end surface of the rim portion, the plane set by the plurality of projected portions may be almost the same height as the plane set by the multiple pins 32, or the plane set by the plurality of projected portions may be slightly lower than that of the multiple pins 32.

In addition, in each of the above embodiments, the case is described where the upper end surface of the rim portion is set almost at the same height as the plane set by the multiple pins 32. The upper end surface of the rim portion, however, may be set slightly lower than the plane set by the multiple pins 32.

Figure 14A:
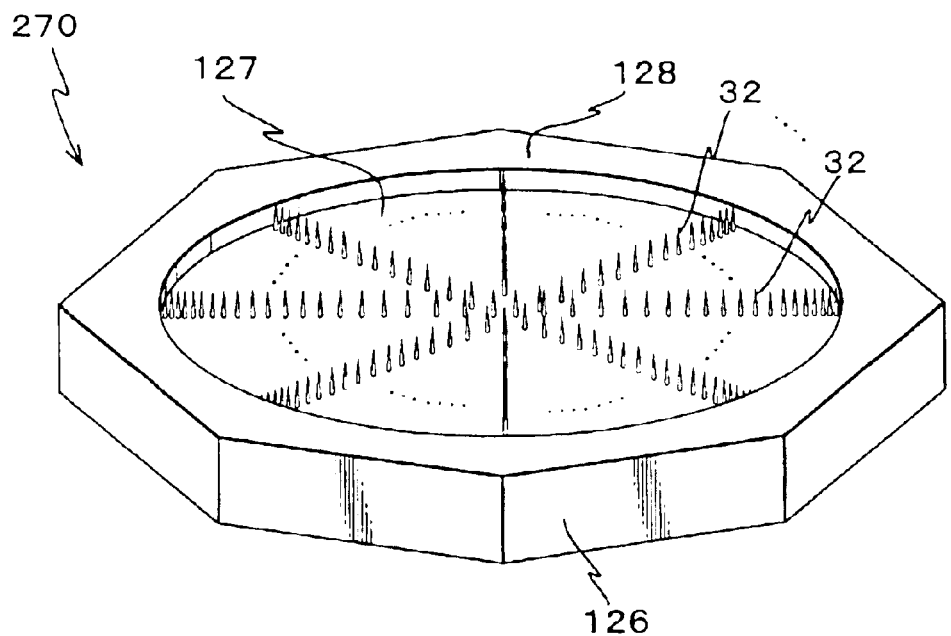
FIGS. 14A and 14B are views for respectively describing a holder main body related to a fourth and a fifth modified example.

In each of the above embodiments, the case is described where the rim portion (protruded portion) which upper end portion is formed higher than its peripheral portion serves as the second support. The concept of the second support, however, is not limited to this, and for example, as in a holder main body 270 related to a fourth modified example shown in FIG. 14A in which an upper surface of a main body 126 is recessed around the center compared with the periphery and a bottom surface 127 inside the recess portion serves as a reference plane, a circular-shaped portion which is in the vicinity of an inner periphery surface of a portion 128 located higher than the reference plane can serve as the second support. In this case, the diameter of the inner periphery surface is preferably set so that the width of the contact surface of portion 128 and wafer W (that is, the distance of the outer periphery of wafer W to the inner periphery surface) satisfies the above equations (6) and (7).

Figure 14B:
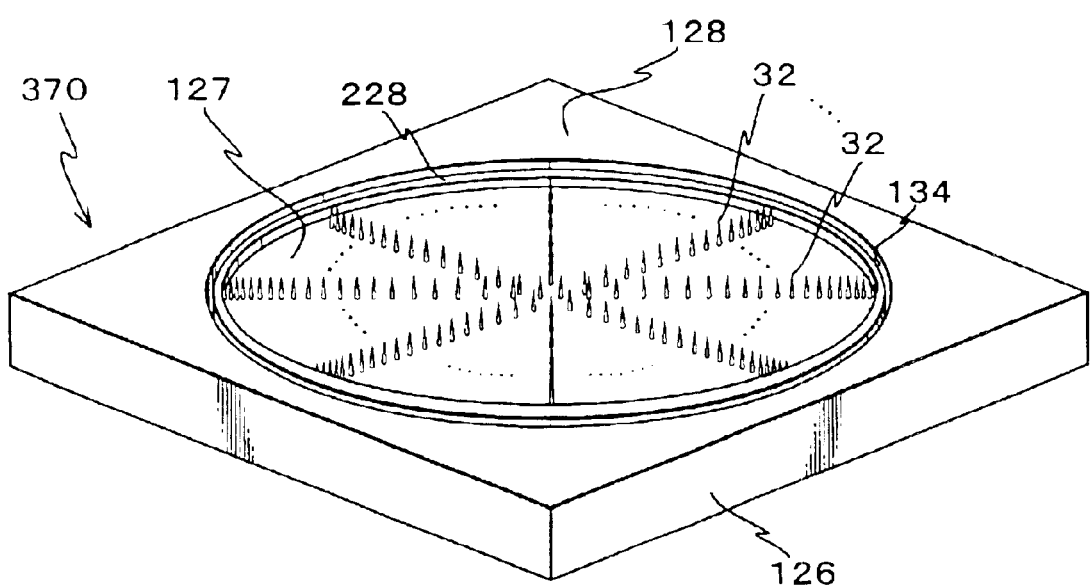

In addition, as in a holder main body 370 related to a fifth modified example shown in FIG. 14B, a ring shaped protruded portion 228 may be further provided on bottom surface 127 inside the recess portion, and when holding wafer W, gas in a ring shaped recess portion 134 formed in between portion 128 and protruded portion 228 may be suctioned by a gas supply/exhaust mechanism similar to the one described earlier in the second embodiment.

Figure 15A:
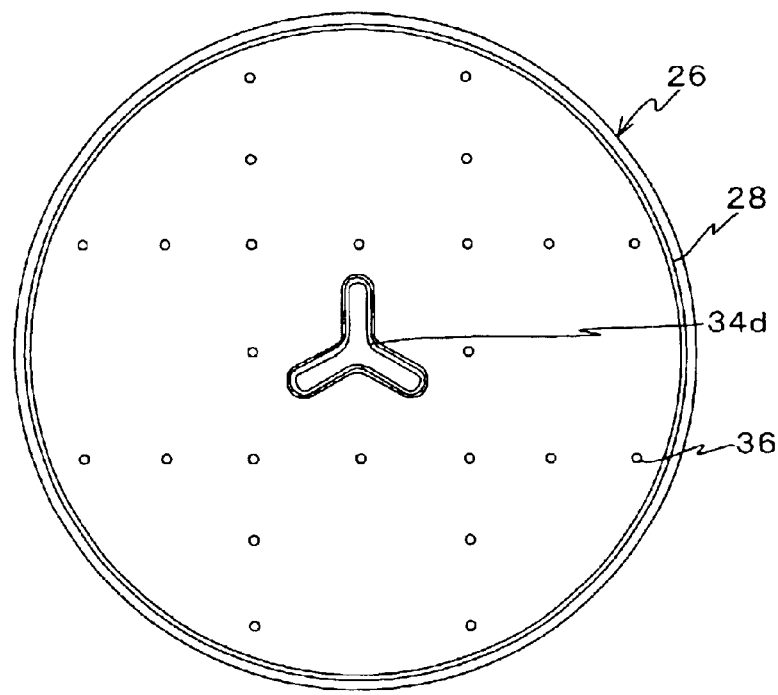
FIG. 15A is a planar view of a holder main body related to a sixth modified example.

In addition, in each of the above embodiments, the plurality of gas supply/exhaust openings 36 are formed from around the center of main body 26 in a radial direction spaced with the angle at center around 120° as is shown in FIG. 2. The present invention, however, is not limited to this. In FIG. 15A, a holder main body related to a sixth modified example that can be applied to each of the above embodiments is shown. In holder main body shown in FIG. 15A, the plurality of gas supply/exhaust openings 36 formed on main body 26 are arranged in a double-cross shape. The holder main body also employs a vertical movement pin (center-up) 34d. Other configurations are the same as is described in each of the embodiments. Accordingly, with the fourth modified example, the same effect as each of the above embodiments can be obtained, and also the partial deformation that occurs during vacuum chucking, or in other words, arrangement error of shot areas on the wafer on which the reticle patterns are transferred can be greatly reduced, which can lead to an improvement in exposure accuracy (transfer accuracy).

Figure 15B:
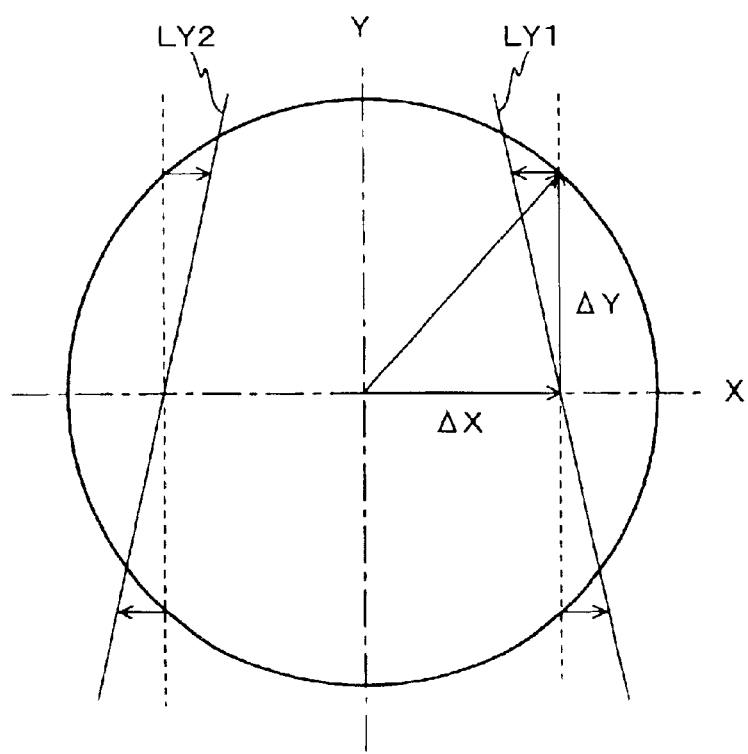
FIG. 15B is a view for describing an arrangement of gas supply/exhaust openings in detail, formed in a main body of the holder main body shown in FIG. 15A.

Following is a description of the arrangement of gas supply/exhaust openings 36 formed on main body 26 shown in FIG. 15A, referring to FIG. 15B. In FIG. 15A, the plurality of gas supply/exhaust openings 36 are arranged in a double-cross shape. In actual, however, the double-cross shape arrangement is formed of a first set of lines, which is made up of a plurality of gas supply/exhaust openings 36 arranged at a predetermined space along a pair of lines extending in a direction almost vertical within the page surface, and a second set of lines, which is made up of a plurality of gas supply/exhaust openings 36 arranged at a predetermined space along a pair of lines extending in a direction almost horizontal within the page surface. And a pair of lines corresponding to either the first set of lines or the second set of lines is arranged in a non-parallel manner. More specifically, as is shown in FIG. 15B, a pair of lines LY1 and LY2 that extend in the vertical direction, corresponding to the first set of lines, is to be arranged in a non-parallel manner, and given that the center of main body 26 is the origin of an orthogonal coordinate system XY, the parameter corresponding to the tilt of lines LY1 and LY2 is expressed as a degree of trapezoid $\Delta$, and $\Delta$ is set as $\Delta=(a/\Delta Y)/\Delta X[ppm/m]$, lines LY1 and LY2 are arranged so that the degree of trapezoid $\Delta$ is, for example, set to 1 and under. For example, with a SEMI standard 12 inch wafer (diameter=approximately 300 mm), in order to set the degree of trapezoid $\Delta$ at 1, given that $\Delta X=\Delta Y=100$ mm, a is to be set as a=10 nm. This allows the deformation of the wafer to be greatly reduced when vacuum chucking is performed, and the exposure accuracy can be improved.

With holder main body 70 referred to earlier, which plurality of gas supply/exhaust openings 36 are arranged in a radial shape as is shown in FIG. 2, the same effect can be obtained as the holder main body shown in FIG. 15A that has the plurality of gas supply/exhaust openings arranged in a double-cross shape, by using only a part of the plurality of gas supply/exhaust openings 36 arranged around the center of main body 26.

In addition, in each of the above embodiments, the case is described where vacuum chucking is employed for the suction mechanism to suction the wafer onto the holder main body. The present invention, however, is not limited to this, and as the suction mechanism, electrostatic chucking may be employed. In such a case, the second support does not need to function as the seal member; therefore, it does not have to be ring shaped or a shape with no edges, and can be formed of a ring shaped protruded portion that has a notch. Or the tip portion of the pins may have the electrostatic chucking functions, so that there is no need to provide the second support itself.

In each of the above embodiments, after the surface of the holder main body is processed and pins and the rim portion are formed, the surface may be coated, for example, with the same or different material with the holder main body, and then the final processing may be performed.

In addition, in the description so far, the case has been described where the main body of the holder main body has a sandwich structure, however, the present invention is not limited to this. That is, the holder main body (or the main body of the substrate holding unit) may be an integrally molded member. In this case, the appearance and shape of the surface on the side where the pins are formed is the same as in the above embodiments. On the other side, however, holes (hollow space) with a predetermined depth that have some kind of a correspondence with the arrangement of the pins can be formed at a predetermined space. In this case, the main body is made in the same method as the first member described earlier. And, with such a holder main body, the weight of the holder main body can also be reduced while maintaining the degree of flatness in the wafer, which leads to improving the position controllability of the wafer stage.

In each of the above embodiments, the case has been described where the holder main body has a three-layer structure. The present invention, however, is not limited to this, and the holder main body have a double-layer structure, formed of a first member on which a plurality of pins are formed and a second member provided on the opposite side of the surface of the first member on which the plurality of pins are formed. In this case, the hollow space can be formed on at least either of the first member or the second member (that is, on either member, or on both members). In addition, the shape of the hollow space is not limited to the above hexagonal or circular openings, but may have other various shapes.

In addition, in each of the above embodiments, the case is described where the substrate holding unit in the present invention is employed as the wafer holder. The present invention, however, is not limited to this, and for example, the substrate holding unit may be applied to a reticle holder that holds a reflection type reticle, since with such reticles the rear surface side is held with the reticle holder.

In addition, in the description so far, a multiple layer structure such as a three-layer structure or a double-layer structure is employed as the holder main body, however, the material used to form the layers does not have to be the same, and different materials can be used. For example, in the three-layer structure, the material forming the first member may differ from the material forming the honeycomb core and the second member. Furthermore, the holder main body may be formed by integrally welding the same material as the first member, or by integrally welding a different material (for example, metal such as aluminum) as the first member. In addition, adhesives may be used to integrally bond the holder main body.

In the above second and third embodiments, the wafer holder lightened by providing a plurality of hollow spaces is used as in the first embodiment, however, the conventional wafer holder that does not have the plurality of hollow spaces provided may be used. In addition, in each of the above embodiments, three vertical movement pins (center-ups) are used, however, for example, a single vertical movement pin may be used, which details are disclosed in, for example, Japanese Patent Laid-open No. 2000-100895 and the corresponding U.S. Pat. No. 6,184,972.

In each of the above embodiments, the case is described where an ultraviolet light source such as the KrF excimer laser light source (output wavelength: 248 nm), or a pulse laser light source in the vacuum ultraviolet region such as the $F_2$ laser or ArF excimer laser is used as the light source. The present invention, however, is not limited to this, and other vacuum ultraviolet light sources such as the $Ar_2$ laser light source or ultraviolet light sources such as the mercury lamp may also be used. In addition, the vacuum ultraviolet light is not limited only to the laser beams emitted from each of the above light sources, and for example, a harmonic may be used, which is obtained by amplifying a single-wavelength laser beam in the infrared or visible range emitted by a DFB semiconductor laser or fiber laser, with a fiber amplifier doped with, for example, erbium (Er) (or both erbium and ytteribium (Yb)), and by converting the wavelength into ultraviolet light using a nonlinear optical crystal. Furthermore, a EUV light, an X-ray, or a charged particle beam such as an electron beam or an ion beam may be used as the exposure beam.

In each of the above embodiments, the case is described where the present invention is applied to the scanning exposure apparatus based on a step-and-scan method. The scope of the invention, as a matter of course, is not limited to this, and the present invention may be suitably applied to a reduction projection exposure apparatus based on a step-and-repeat method, a mirror projection aligner, or an exposure apparatus based on a proximity method.

The exposure apparatus in each of the above embodiments can be built by incorporating the illumination optical system made up of a plurality of lenses and the projection optical system into the main body of the exposure apparatus and performing optical adjustment, while incorporating the reticle stage and the wafer stage that are made up of various mechanical components into the main body of the exposure apparatus, connecting the wiring and piping, and furthermore, performing total adjustment (such as electrical adjustment and operational adjustment). The exposure apparatus is preferably made in a clean room where temperature, degree of cleanliness, and the like are controlled.

In addition, each of the above embodiments, the case is described where the present invention is applied to the exposure apparatus used for manufacturing semiconductors. The present invention, however, is not limited to this, and the present invention may be widely applied to applied to an exposure apparatus for manufacturing crystal displays used to transfer crystal display device patterns onto a square-shaped glass plate, and an exposure apparatus for manufacturing a thin film magnetic head, a pick-up device, an organic EL display, a micromachine, a DNA chip, or the like.

In addition, the present invention can also be applied to an exposure apparatus used not only for manufacturing semiconductor devices such as a microdevice, but also to an exposure apparatus which transfers a circuit pattern onto a glass substrate or a silicon wafer when manufacturing reticles and masks that are used in an optical exposure apparatus, an EUV exposure apparatus, an X-ray exposure apparatus, and an electron beam exposure apparatus, or the like. Normally, an exposure apparatus that uses DUV (deep ultraviolet) light or VUV (vacuum ultraviolet) light uses a transmittance type reticle, and as a reticle substrate materials such as silica glass, fluorine-doped silica glass, fluorite, magnesium fluoride, or crystal are used.

<<Device Manufacturing Method>>

An embodiment of a device manufacturing method using the above exposure apparatus in a lithographic process is described next.

Figure 16:
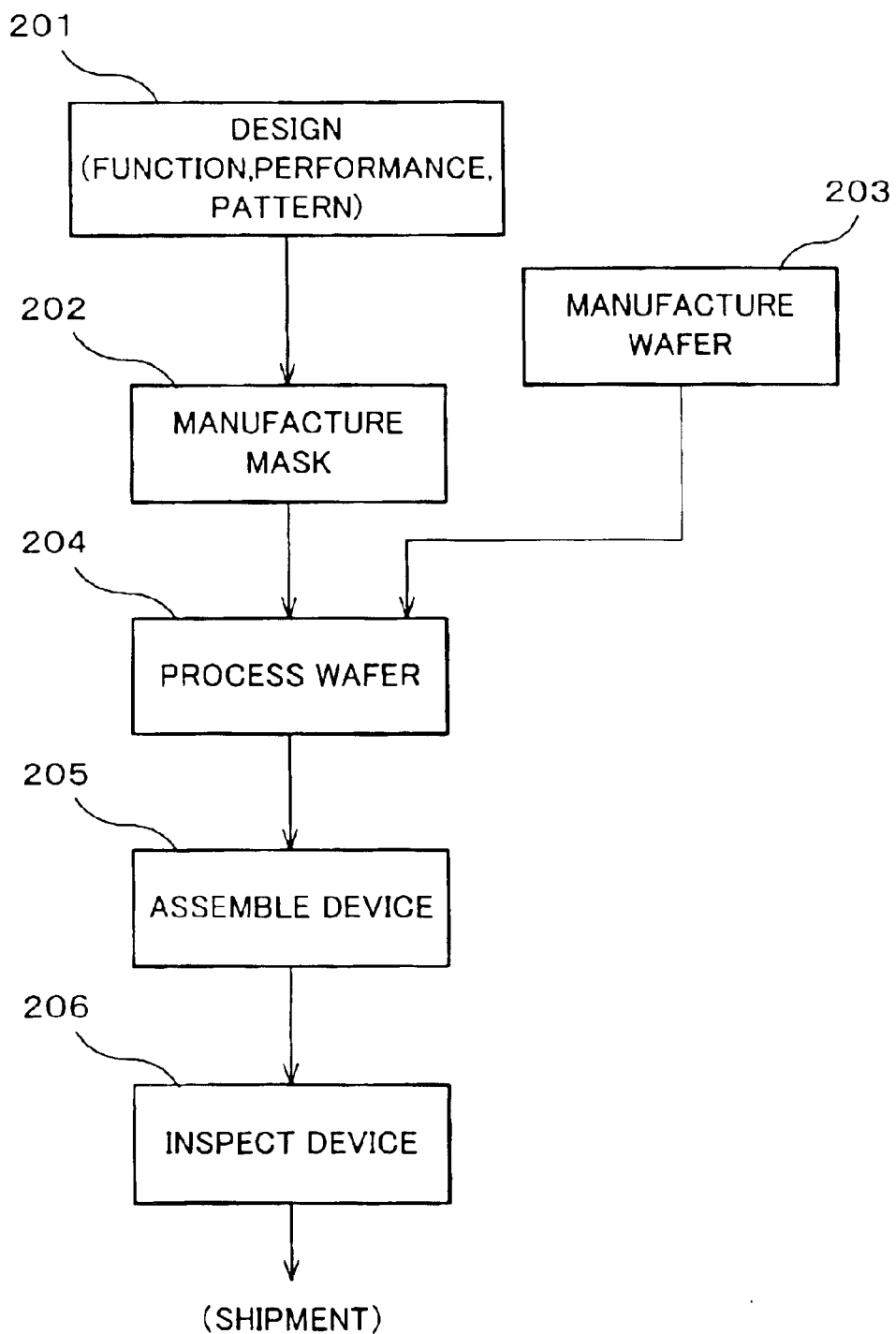
FIG. 16 is a flow chart for explaining an embodiment of a device manufacturing method according to the present invention.

FIG. 16 is a flow chart showing an example of manufacturing a device (a semiconductor chip such as an IC or LSI, a liquid crystal panel, a CCD, a thin magnetic head, a micromachine, or the like). As shown in FIG. 16, in step 201 (design step), function/performance is designed for a device (e.g., circuit design for a semiconductor device) and a pattern to implement the function is designed. In step 202 (mask manufacturing step), a mask on which the designed circuit pattern is formed is manufactured. In step 203 (wafer manufacturing step), a wafer is manufacturing by using a silicon material or the like.

In step 204 (wafer processing step), an actual circuit and the like is formed on the wafer by lithography or the like using the mask and wafer prepared in steps 201 to 203, as will be described later. Next, in step 205 (device assembly step) a device is assembled using the wafer processed in step 204. The step 205 includes processes such as dicing, bonding, and packaging (chip encapsulation), as necessary.

Finally, in step 206 (inspection step), a test on the operation of the device, durability test, and the like are performed. After these steps, the device is completed and shipped out.

Figure 17:
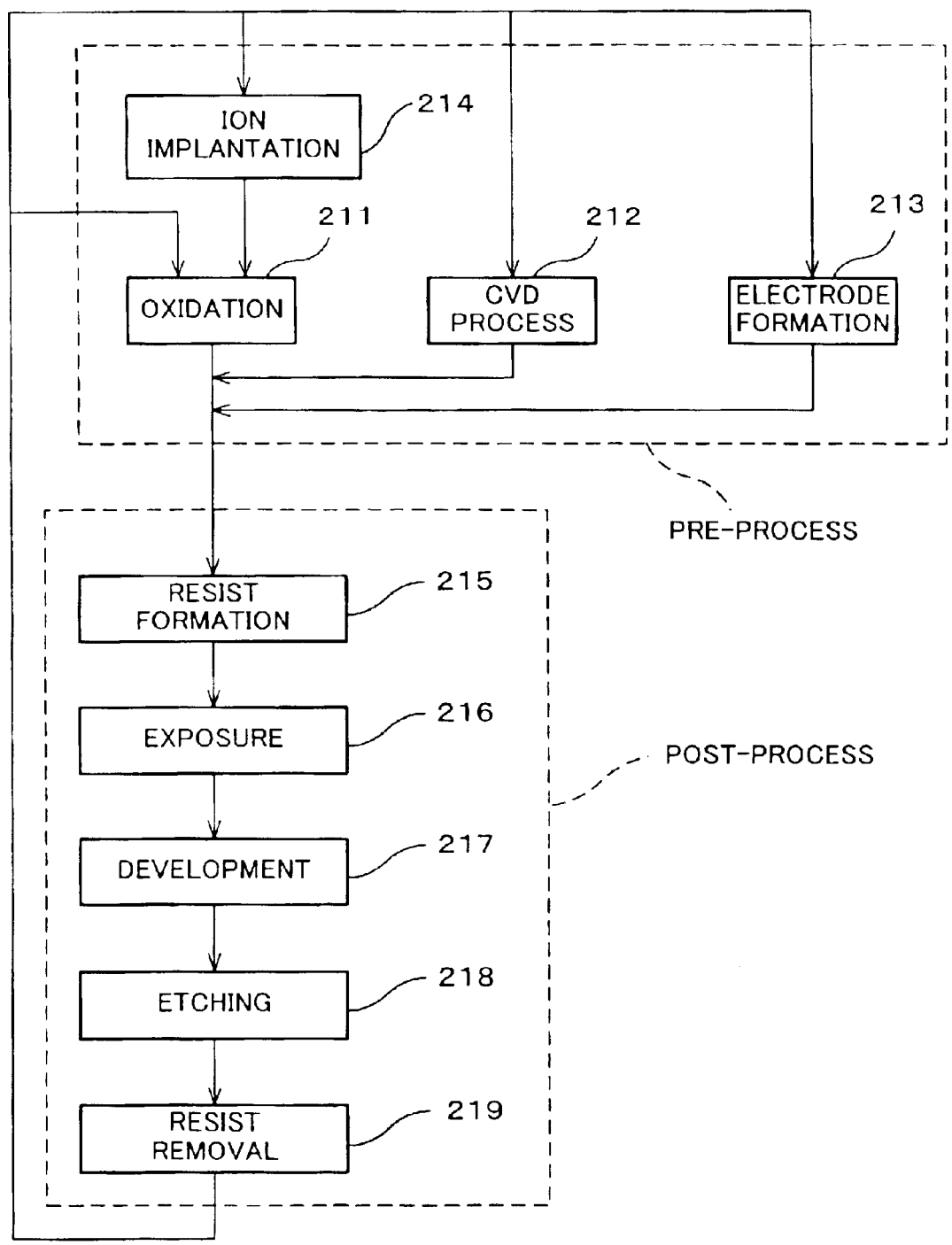
FIG. 17 is a flow chart for showing a process in step 204 in FIG. 16.

FIG. 17 is a flow chart showing a detailed example of step 204 described above in manufacturing the semiconductor device. Referring to FIG. 17, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for the respective steps in the wafer process and are selectively executed based on the processing required in the respective steps.

When the above pre-process is completed in the respective steps in the wafer process, a post-process is executed as follows. In this post-process, first, in step 215 (resist formation step), the wafer is coated with a photosensitive agent. Next, as in step 216, the circuit pattern on the mask is transferred onto the wafer by the lithography system (exposure apparatus) and exposure method described in the above embodiments. Then, in step 218 (etching step), an exposed member of an area other than the area where the resist remains is removed by etching. Finally, in step 219 (resist removing step), when etching is completed, the resist that is no longer necessary is removed.

By repeatedly performing these pre-process and post-process steps, multiple circuit patterns are formed on the wafer.

When using the device manufacturing method described so far in the embodiment, since the exposure apparatus in the above embodiments are used in the exposure process (step 216), the reticle pattern can be transferred onto the wafer with high throughput and good accuracy. As a consequence, productivity of high integration devices (including yield) can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A substrate holding unit that holds a plate-shaped substrate, said unit comprising:
    a holding unit main body that has a plurality of projected first supports arranged on a surface of said holding unit main body within a predetermined area with each of tip portions arranged almost flush, supporting said substrate, and
    a plurality of hollow spaces formed in an arrangement corresponding to an arrangement of said plurality of first supports in a portion excluding said surface of said holding unit main body, in at least a portion between said surface and a surface located on the other side of said surface.

2. The substrate holding unit of claim 1 wherein
    said first supports are arranged on said surface of said holding unit main body, with at least one first support individually corresponding to each of said hollow spaces.

3. The substrate holding unit of claim 2 wherein
    said plurality of hollow spaces are spaced constantly apart on said holder unit main body two-dimensionally, and
    said first supports that are arranged with at least one first support individually corresponding to each of said hollow spaces, are totally arranged with equal spacing.

4. The substrate holding unit of claim 2 wherein
    said plurality of first supports are arranged so that spacing in between said first supports partially differ on said surface of said holding unit main body, and
    said plurality of hollow spaces are arranged in said portions of said holding unit main body, with at least one of spacing and size different.

5. The substrate holding unit of claim 1 wherein
    said holing unit main body is integrally formed including:
        a first member that makes up said plurality of first supports; and
        a second member that is provided on the other side of said surface, and
    said plurality of hollow spaces are formed in at least one of said first member and said second member.

6. The substrate holding unit of claim 5 wherein
    said holding unit main body is integrally formed, by welding at least the same material as said first member.

7. The substrate holding unit of claim 5 wherein
    said holding unit main body is integrally formed, by welding at least a different material as said first member.

8. The substrate holding unit of claim 5 wherein
    said holding unit main body is integrally formed, by using adhesives.

9. The substrate holding unit of claim 1 wherein
    said holding unit main body is made up of:
        a plurality of first members on said surface side;
        a second member on a surface located on the other side of said surface; and
        a core member in which said plurality of hollow spaces are formed, and
    said holding unit main body has a sandwich structure, clamping said core member in between said first member and said second member.

10. The substrate holding unit of claim 9 wherein said core member is a honeycomb core.

11. The substrate holding unit of claim 1 wherein
    said holding unit main body further has a second support, which is arranged outside said predetermined area on said surface of said holding unit main body, enclosing said area and supporting said substrate in a state where its degree of flatness is almost maintained with said plurality of first supports.

12. The substrate holding unit of claim 11, said substrate holding unit further comprising:

a suction mechanism that suctions said substrate with respect to a tip portion of each of said plurality of first supports and an upper end portion of said second support.

13. The substrate holding unit of claim 11 wherein among said plurality of first supports, at least said first supports located in the vicinity of said second support are arranged with denser spacing compared with said first supports located elsewhere.

14. The substrate holding unit of claim 11 wherein a contact area of said second support with said substrate is set at 20% and under of a total contact area of said plurality of first supports and said second support with said substrate.

15. An exposure apparatus that exposes a substrate with an energy beam to form a predetermined pattern, said exposure apparatus comprising:

a substrate holding unit according to claim 1 which holds said substrate; and a substrate stage on which said substrate holding unit is mounted, which is moveable in at least one direction in a two dimensional plane.

16. The exposure apparatus of claim 15, said exposure apparatus further comprising:

a mask stage that holds a mask on which said pattern is formed;

a projection optical system that projects said energy beam emitted from said mask onto said substrate;

a focal position detection system that detects a position related to an optical axis direction of said projection optical system and an amount of tilt with respect to a surface perpendicular to said optical axis direction of a surface of said substrate held by said substrate holding unit; and a drive unit that drives said substrate holding unit in at least one of said optical axis direction and a direction of inclination with respect to a surface perpendicular to said optical axis direction, based on detection results of said focal position detection system.

17. The exposure apparatus of claim 16, said exposure apparatus further comprising:

a synchronous drive unit that synchronously drives said mask stage and said substrate stage in said one direction.

18. A device manufacturing method including a lithographic process, wherein in said lithographic process exposure is performed using said exposure apparatus of claim 15.

19. A substrate holding unit which holds a plate-shaped substrate, said unit comprising:

a holding unit main body that has a plurality of projected first supports arranged within a predetermined area with each of tip portions arranged almost flush, supporting said substrate, and a second support, which is arranged outside said area, enclosing at least a large part outside said area, wherein said substrate is supported with said plurality of first supports and said second support in a state where its flatness is almost maintained, and among said plurality of first supports, at least said first supports located in the vicinity of said second support are arranged with denser spacing compared with said first supports located elsewhere.

20. The substrate holding unit of claim 19 wherein said plurality of first supports are arranged with spacing in between adjacent first supports wider when further away from said second support.

21. The substrate holding unit of claim 19 wherein said plurality of first supports are arranged in a plurality of rings of concentric circles with a reference point on said holding unit main body serving as a center, which corresponds to a center position of said substrate.

22. The substrate holding unit of claim 19, said substrate holding unit further comprising:

a suction mechanism that suctions said substrate with respect to a tip portion of each of said plurality of first supports and an upper end portion of said second support.

23. The substrate holding unit of claim 22 wherein said second support has a circular inner peripheral surface that entirely surrounds an area where said plurality of first supports are arranged, and said suction mechanism is a vacuum chucking mechanism that creates a vacuum state in a space formed with said substrate and said holding unit main body when said holding unit main body supports said substrate, at a side inside said inner peripheral surface of said second support.

24. The substrate holding unit of claim 23 wherein said second support has a circular protruded portion and a circular recessed portion arranged concentrically on an outer side of said protruded portion, and said vacuum chucking mechanism creates a vacuum state even in said circular recessed portion.

25. The substrate holding unit of claim 24 wherein said second support has at least two circular protruded portions arranged concentrically, and said vacuum chucking mechanism creates a vacuum state even in a space formed in between adjacent circular protruded portions of said at least two circular protruded portions.

26. The substrate holding unit of claim 19 wherein a contact area of said second support with said substrate is set at 20% and under of a total contact area of said plurality of first supports and said second support with said substrate.

27. The substrate holding unit of claim 26 wherein a proportion of a contact area of said plurality of first supports and said second support with said substrate is set at 3% and under, in an entire area on a side of a surface of said substrate supported by said first supports and said second support.

28. An exposure apparatus that transfers a pattern formed on a mask onto a substrate via a projection optical system, said exposure apparatus comprising:

a substrate holding unit of claim 19;

a focal position detection system that detects a position related to an optical axis direction of said projection optical system and an amount of inclination with respect to a surface perpendicular to said optical axis direction of a surface of said substrate held by said substrate holding unit; and a drive unit that drives said substrate holding unit in at least one of said optical axis direction and a direction of inclination with respect to a surface perpendicular to said optical axis direction, based on detection results of said focal position detection system.

29. A device manufacturing method including a lithographic process, wherein in said lithographic process exposure is performed using said exposure apparatus of claim 28.

30. A substrate holding unit which holds a plate-shaped substrate, said unit comprising:
a holding unit main body that has
a plurality of projected first supports arranged within a predetermined area with each of tip portions arranged almost flush, supporting said substrate, and
a second support, which is arranged outside said area, enclosing at least a large part outside said area, wherein
said substrate is supported with said plurality of first supports and said second support in a state where its flatness is almost maintained, and
a contact area of said second support with said substrate is set at 20% and under of a total contact area of said plurality of first supports and said second support with said substrate.

31. An exposure apparatus that transfers a pattern formed on a mask onto a substrate via a projection optical system, said exposure apparatus comprising:
a substrate holding unit of claim 30;
a focal position detection system that detects a position related to an optical axis direction of said projection optical system and an amount of inclination with respect to a surface perpendicular to said optical axis direction of a surface of said substrate held by said substrate holding unit; and
a drive unit that drives said substrate holding unit in at least one of said optical axis direction and a direction of inclination with respect to a surface perpendicular to said optical axis direction, based on detection results of said focal position detection system.

32. A device manufacturing method including a lithographic process, wherein in said lithographic process exposure is performed using said exposure apparatus of claim 31.

* * * * *